(12) United States Patent
Marchand

(10) Patent No.: US 12,269,095 B2
(45) Date of Patent: Apr. 8, 2025

(54) PROCESS CHAMBER COMPONENT AND METHOD OF FORMING A SURFACE TEXTURE

(71) Applicant: Cleanpart Group GmbH, Asperg (DE)

(72) Inventor: Olivier Marchand, Genoble (FR)

(73) Assignee: Cleanpart Group GmbH, Asperg (DE)

( * ) Notice: Subject to any disclaimer, the term of this patent is extended or adjusted under 35 U.S.C. 154(b) by 832 days.

(21) Appl. No.: 16/728,118

(22) Filed: Dec. 27, 2019

(65) Prior Publication Data
US 2020/0176225 A1 Jun. 4, 2020

Related U.S. Application Data

(63) Continuation of application No. PCT/EP2018/068083, filed on Jul. 4, 2018.

(30) Foreign Application Priority Data

Jul. 4, 2017 (WO) ................. PCT/EP2017/066669

(51) Int. Cl.
*B22F 5/10* (2006.01)
*B22F 10/25* (2021.01)
(Continued)

(52) U.S. Cl.
CPC .............. *B22F 5/106* (2013.01); *B22F 10/25* (2021.01); *B22F 10/28* (2021.01); *B23K 26/355* (2018.08);
(Continued)

(58) Field of Classification Search
CPC .......... B22F 10/25; B22F 10/28; B22F 10/68; B22F 12/53; B22F 2003/245;
(Continued)

(56) References Cited

U.S. PATENT DOCUMENTS 6,506,312 B1 * 1/2003 Bottomfield .......... C23C 14/564
                                                        204/298.31
8,486,870 B1 * 7/2013 Malshe ................ C10M 171/00
                                                        508/108
(Continued)

FOREIGN PATENT DOCUMENTS

CN        204570038       8/2015
CN        105034361      11/2015
(Continued)

OTHER PUBLICATIONS

Yadroitseva et al.; "Manufacturing of fine-structured 3D porous filter elements by selective laser melting"; Applied Surface Science 255, 2009, pp. 5523-5527.

*Primary Examiner* — Philip C Tucker
*Assistant Examiner* — Jimmy R Smith, Jr.
(74) *Attorney, Agent, or Firm* — Lipsitz & McAllister, LLC

(57) ABSTRACT

The invention relates to a method of forming a surface texture on a process chamber component in the form of an annular shield element for use in a substrate processing chamber which is designed for manufacturing wafers, chips or dies, the process chamber component forming a shield element and having at least one component surface, the method comprising the step of forming the surface texture on the at least one component surface so as to define at least one recess in the surface texture and that the total surface area defined by the surface texture is greater than the total surface area defined by the at least one component surface, wherein the surface texture is applied to the at least one component surface by additive manufacturing. Furthermore, an improved process chamber component is proposed.

9 Claims, 25 Drawing Sheets

(51) Int. Cl.
  *B22F 10/28* (2021.01)
  *B22F 10/68* (2021.01)
  *B22F 12/53* (2021.01)
  *B23K 26/352* (2014.01)
  *B33Y 10/00* (2015.01)
  *B33Y 30/00* (2015.01)
  *B33Y 80/00* (2015.01)
  *C23C 14/56* (2006.01)
  *C23C 16/44* (2006.01)
  *H01J 37/32* (2006.01)

(52) U.S. Cl.
  CPC ............... *B33Y 10/00* (2014.12); *B33Y 30/00* (2014.12); *B33Y 80/00* (2014.12); *C23C 14/564* (2013.01); *C23C 16/4404* (2013.01); *H01J 37/32477* (2013.01); *H01J 37/32871* (2013.01); *B22F 10/68* (2021.01); *B22F 12/53* (2021.01); *H01J 2237/022* (2013.01)

(58) Field of Classification Search
  CPC .......... B22F 2005/005; B22F 2007/068; B22F 2998/10; B22F 2999/00; B22F 3/1103; B22F 3/1115; B22F 5/106; B22F 7/002; B22F 7/004; B22F 7/008; B22F 7/062; B22F 5/12; B23K 15/0086; B23K 2103/04; B23K 2103/10; B23K 2103/14; B23K 26/123; B23K 26/144; B23K 26/1476; B23K 26/342; B23K 26/355; B33Y 10/00; B33Y 30/00; B33Y 80/00; C22C 1/08; C23C 14/564; C23C 16/4401; C23C 16/4404; C23C 16/4585; H01J 2237/022; H01J 37/32477; H01J 37/32871; Y02P 10/25; B29C 64/141; B29C 64/153; B29C 64/165

See application file for complete search history.

(56) References Cited

U.S. PATENT DOCUMENTS

| | | | |
|---|---|---|---|
| 2005/0048876 A1* | 3/2005 | West | C23C 14/564 451/37 |
| 2006/0105182 A1 | 5/2006 | Brueckner et al. | |
| 2013/0006354 A1 | 1/2013 | Pressacco | |
| 2014/0195001 A1 | 7/2014 | Grohowski, Jr. | |
| 2016/0010863 A1 | 1/2016 | Ott et al. | |
| 2016/0233060 A1* | 8/2016 | Narendrnath | B33Y 10/00 |
| 2017/0089238 A1 | 3/2017 | Eyko et al. | |

FOREIGN PATENT DOCUMENTS

| | | | |
|---|---|---|---|
| EP | 1683593 | 7/2006 | |
| EP | 2741317 A1 * | 6/2014 | ......... C23C 16/4401 |
| EP | 2950972 | 12/2016 | |
| WO | 2005001918 | 1/2005 | |

* cited by examiner

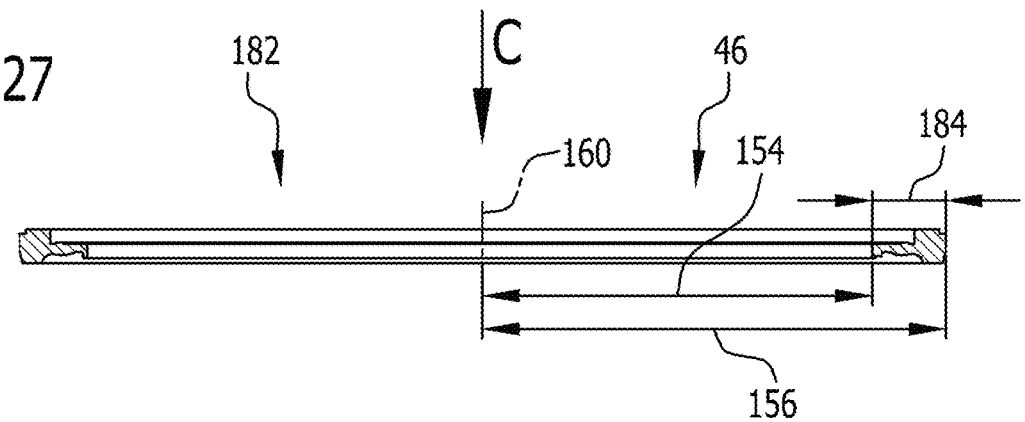
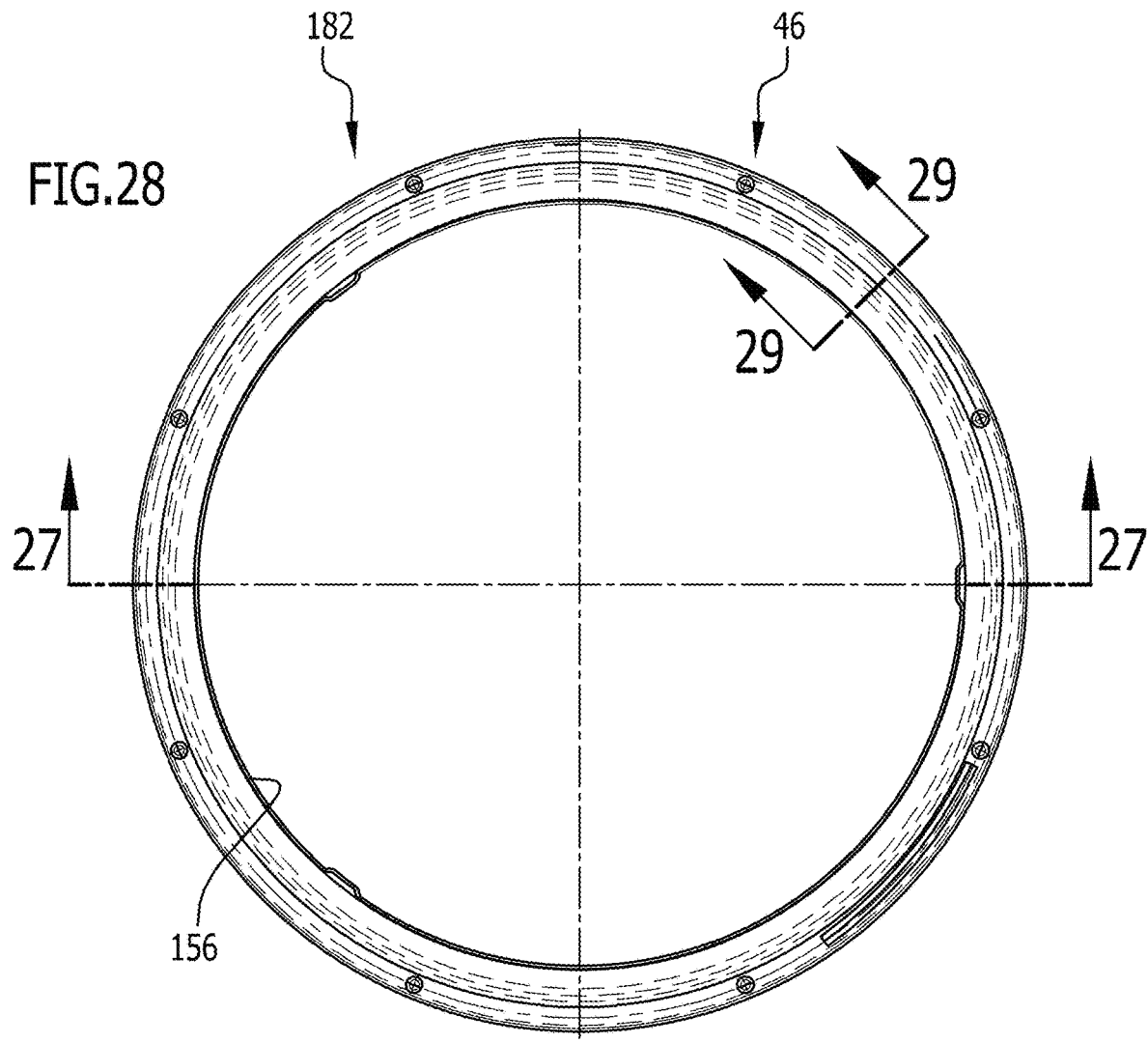

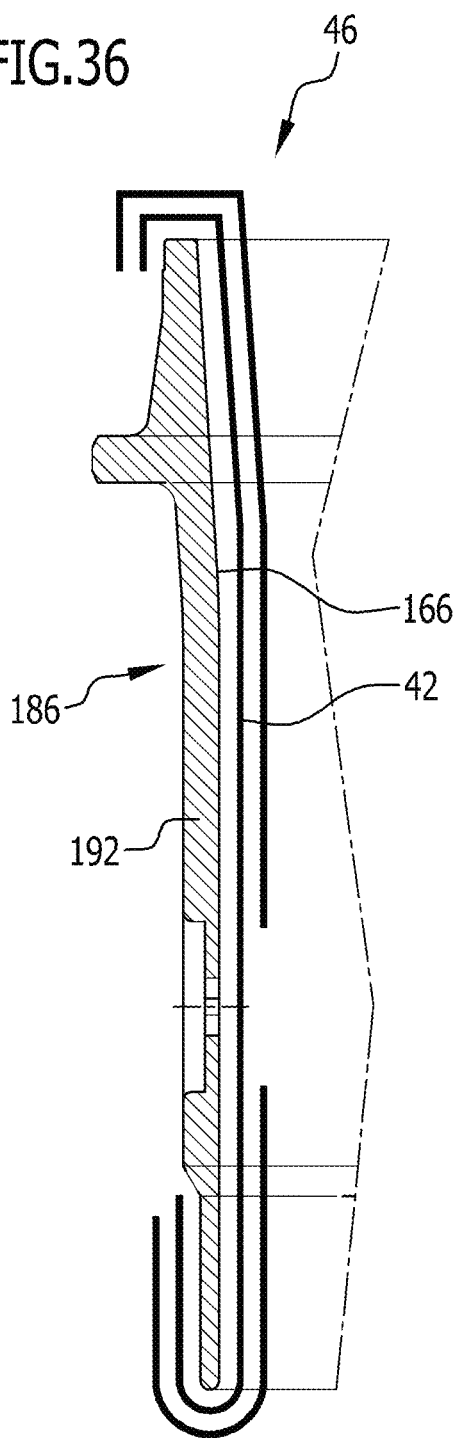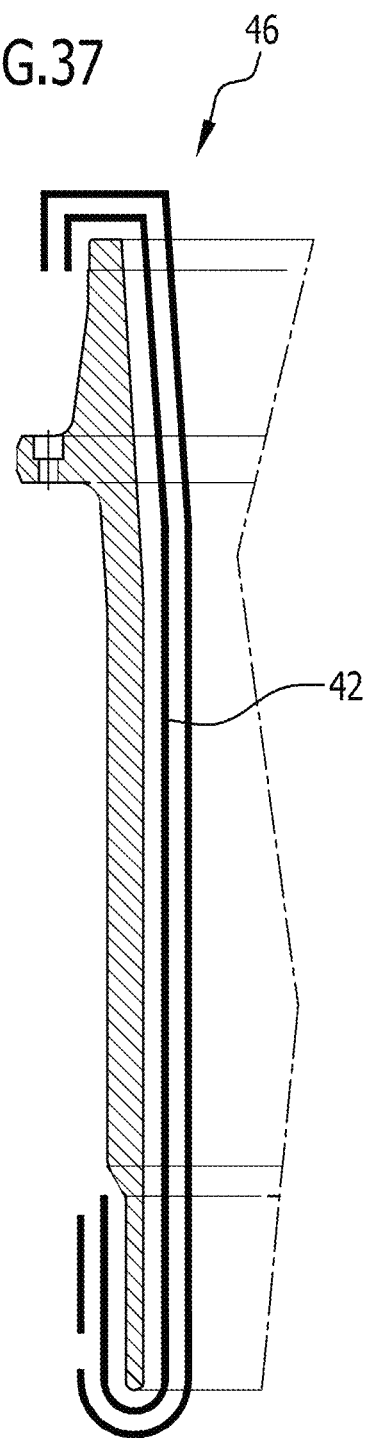

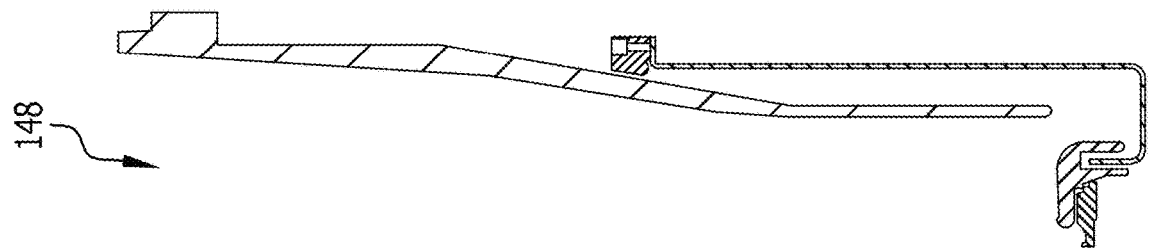
FIG.43
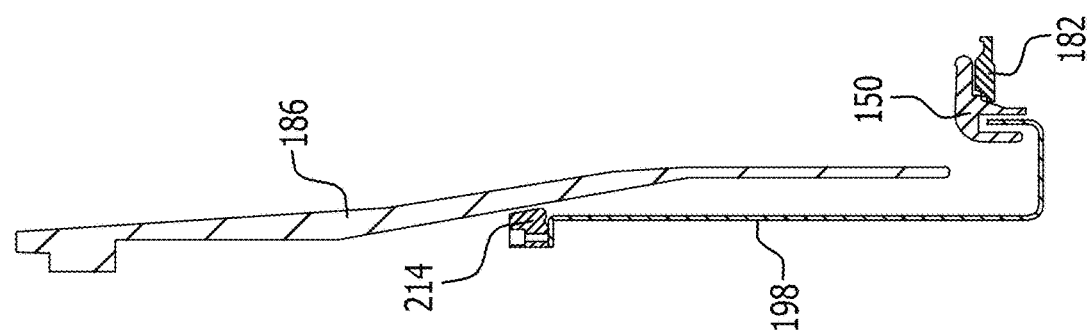

PROCESS CHAMBER COMPONENT AND METHOD OF FORMING A SURFACE TEXTURE

CROSS-REFERENCE TO RELATED APPLICATIONS

This application is a continuation of international application number PCT/EP2018/068083 filed on Jul. 4, 2018 and claims the benefit of international application number PCT/EP2017/066669 filed on Jul. 4, 2017, which are incorporated herein by reference in their entirety and for all purposes.

FIELD OF THE INVENTION

The present invention relates to methods of forming a surface texture on a process chamber component generally, and more specifically to a method of forming a surface texture on a process chamber component in the form of an annular shield element for use in a substrate processing chamber which is designed for manufacturing wafers, chips or dies, the process chamber component forming a shield and having at least one component surface, the method comprising the step of forming the surface texture on the at least one component surface so as to define at least one recess in the surface texture and so that the total surface area defined by the surface texture is greater than the total surface area defined by the at least one component surface.

Further, the invention relates to process chamber components generally, and more specifically to a process chamber component in the form of an, in particular annular, shield element for use in a substrate processing chamber which is designed for manufacturing wafers, chips or dies, the process chamber component having an annular process chamber component structure defining at least one component surface, a surface texture being arranged on the at least one component surface and having at least one recess, wherein the total surface area defined by the surface texture is greater than the total surface area defined by the at least one component surface.

Moreover, the invention relates to process kits for substrate processing chambers generally, and more specifically to a process kit for a substrate processing chamber, the process kit comprising a shield element, in particular in the form of a ring, adapted to at least partially surround a substrate in the processing chamber.

Furthermore, the invention relates to substrate processing chambers generally, and more specifically to a substrate processing chamber comprising at least one process chamber component.

BACKGROUND OF THE INVENTION

Methods and process chamber components as defined in the outset are described, in particular, in US 2004/0056211 A1, US 2006/0105182 A1 and US 2010/0108641 A1. The described surface textures comprise a plurality of electron beam textured features that are formed by scanning an electron beam across a surface of the process chamber component or across a metal coating overlying a structure of the process chamber component.

The described textured features as, for example, depressions and protuberances, are formed directly in the surface of the process chamber component. This means that the surface of the process chamber component is modified. As a consequence, if the process chamber component is to be refurbished, the outer surface of the process chamber component has to be partially removed. If a coating is used for covering the process chamber component before texturizing the coating by scanning an electron beam over it, a sophisticated two-step process has to be used. The outer surface of the process chamber component has to be provided with a metal coating in a first step and then, in a second step, the electron beam textured features have to be formed.

SUMMARY OF THE INVENTION

In a first aspect of the invention, a method of forming a surface texture on a process chamber component in the form of an annular shield element for use in a substrate processing chamber is proposed, said substrate processing chamber is designed for manufacturing wafers, chips or dies. The process chamber component has at least one component surface. The method comprises the step of forming the surface texture on the at least one component surface so as to define at least one recess in the surface texture and so that the total surface area defined by the surface texture is greater than the total surface area defined by the at least one component surface. The surface texture is applied to the at least one component surface by additive manufacturing.

In a second aspect of the invention, a process chamber component in the form of an, in particular annular, shield element for use in a substrate processing chamber is proposed, said substrate processing chamber is designed for manufacturing wafers, chips or dies. The process chamber component has an annular process chamber component structure defining at least one component surface. A surface texture is arranged on the at least one component surface and has at least one recess. The total surface area defined by the surface texture is greater than the total surface area defined by the at least one component surface. The surface texture is applied to the at least one component surface by additive manufacturing.

In a third aspect of the invention, a process kit for a substrate processing chamber is proposed. The process kit comprises at least one shield element, in particular in the form of a ring, adapted to at least partially surround a substrate in the substrate processing chamber. The at least one shield element is in the form of a process chamber component, in particular annular, for use in a substrate processing chamber is proposed, said substrate processing chamber is designed for manufacturing wafers, chips or dies. The process chamber component has an annular process chamber component structure defining at least one component surface. A surface texture is arranged on the at least one component surface and has at least one recess. The total surface area defined by the surface texture is greater than the total surface area defined by the at least one component surface. The surface texture is applied to the at least one component surface by additive manufacturing.

In a fourth aspect of the invention, a substrate processing chamber is proposed. The substrate processing chamber comprises at least one process chamber component or a process kit. The process chamber component is in the form of an, in particular annular, shield element for use in a substrate processing chamber is proposed, said substrate processing chamber is designed for manufacturing wafers, chips or dies. The process chamber component has an annular process chamber component structure defining at least one component surface. A surface texture is arranged on the at least one component surface and has at least one recess. The total surface area defined by the surface texture is greater than the total surface area defined by the at least one component surface. The surface texture is applied to the at least one component surface by additive manufacturing. The process kit is designed for a substrate processing chamber. The process kit comprises at least one shield element, in particular in the form of a ring, adapted to at least partially surround a substrate in the substrate processing chamber. The at least one shield element is in the form of a process chamber component, in particular annular, for use in a substrate processing chamber is proposed, said substrate processing chamber is designed for manufacturing wafers, chips or dies. The process chamber component has an annular process chamber component structure defining at least one component surface. A surface texture is arranged on the at least one component surface and has at least one recess.

The total surface area defined by the surface texture is greater than the total surface area defined by the at least one component surface. The surface texture is applied to the at least one component surface by additive manufacturing.

BRIEF DESCRIPTION OF THE DRAWING FIGURES

The foregoing summary and the following description may be better understood in conjunction with the drawing figures, of which:

FIG. 27 shows a cross-sectional view along line 27-27 in FIG. 28 of a further embodiment of a process chamber component;

FIG. 28 shows a top plan view of the process chamber component shown in FIG. 27 in the direction of arrow C;

FIG. 36 shows a cross-sectional view along line 36-36 in FIG. 35;

FIG. 37 shows a cross-sectional view along line 37-37 in FIG. 35;

FIG. 43 shows a cross-sectional view of a further embodiment of a shield arrangement.

DETAILED DESCRIPTION OF THE INVENTION

Figure 1:
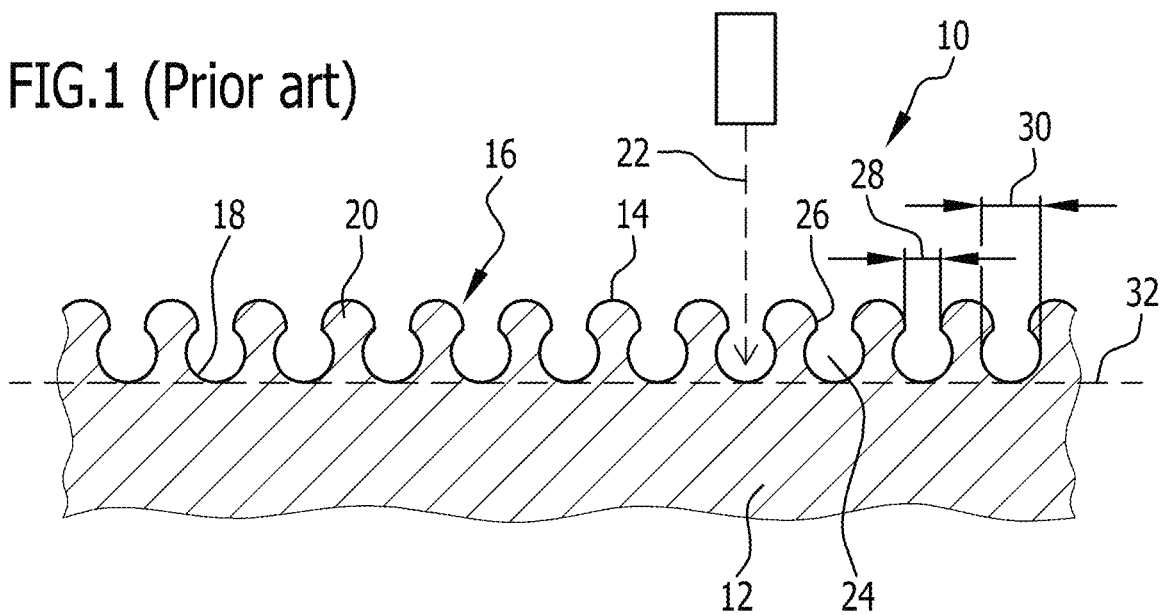
FIG. 1 shows a cross-sectional view of a process chamber component having a surface texture made by electron beam texturizing.

Although the invention is illustrated and described herein with reference to specific embodiments, the invention is not intended to be limited to the details shown. Rather, various modifications may be made in the details within the scope and range of equivalents of the claims and without departing from the invention.

The present invention relates to a method of forming a surface texture on a process chamber component in the form of an annular shield element for use in a substrate processing chamber which is designed for manufacturing wafers, chips or dies, the process chamber component having at least one component surface, the method comprising the step of forming the surface texture on the at least one component surface so as to define at least one recess in the surface texture and so that the total surface area defined by the surface texture is greater than the total surface area defined by the at least one component surface, wherein the surface texture is applied to the at least one component surface by additive manufacturing.

The proposed improved method of forming a surface texture on a process chamber component allows forming the surface texture generally in a single step or process. The surface texture is added on or onto the component surface preferably without modifying the component surface at all. The surface texture is simply added on the component surface. This allows a complete removal of the formed surface texture without removing any portion of the process chamber component itself. In particular, if the process chamber component is covered with a coating, the coating has to be applied in a first step of the method, whereas the surface texture is provided in a second step by scanning an electron beam across the coating. It should also be noted, that scanning an electron beam over the component surface and the coating does not necessarily exclude that the at least one component surface is modified by the electron beam. Further, it should be noted that not only one component surface may be texturized according to the invention but also two, three and more, in particular, all component surfaces of the process chamber component. Moreover, providing a coating in a first step and then texturizing this coating with an electron beam typically requires more coating material than only applying the surface texture by additive manufacturing. Therefore, the proposed improved method can be less costly than the methods known from the prior art. Moreover, removing a complete coating from the at least one component surface can be more expensive and time-consuming than removing a surface texture applied on top of the at least one component surface. Furthermore, the proposed improved method results in a significant greater durability and a longer service life of the process chamber component compared to methods using an electron beam for texturizing the component surface of a process chamber component. In principle, it is also conceivable that the surface texture covers the at least one component surface completely. An annular structure in the context of this application is to be understood as a structure that is closed within itself like, for example, a ring, a sleeve or a tube.

Substrate processing chambers are used, in particular, for manufacturing wafers, chips or dies. Such chambers are typically operated under high vacuum or even ultra-high vacuum, also called vacuum chambers, for texturizing substrates by chemical vapor deposition (CVD) or physical vapor deposition (PVD), sputtering or plasma etching in order to form or construct wafers, chips or dies.

Preferably, the surface texture is applied so as to only partially cover the at least one component surface. This allows providing a surface texture with a minimum thickness since, for example, a depression or recess can partially be bordered by the at least one component surface. Thus, the required material for forming the surface texture can be minimized.

Furthermore, it is advantageous if the surface texture is applied so as to form the at least one recess in the form of an opening which allows direct access to the at least one component surface. In other words, such a surface texture covers the at least one component surface only partially so that any opening formed in the surface texture and forming a recess is at least partially bordered or delimited by the at least one component surface.

In accordance with a preferred embodiment of the invention the surface texture is applied to the at least one component surface without modifying or damaging the at least one component surface. As already described above, this improvement allows refurbishing the process chamber component without any limitation. This is possible since the at least one component surface is not modified at all. Thus, the surface texture can be removed, the at least one component surface can be cleaned, and, thereafter, the at least one component surface can be provided with a new surface texture for giving the process chamber component its functional properties of an improved adhesion of particles in order to avoid any contamination of, for example, wafers, chips or dies manufactured in a process chamber.

Preferably, the additive manufacturing of the surface texture is carried out by at least one of 3D printing, selective laser sintering, direct metal deposition and laser additive manufacturing. This list is not exclusive. Any of the listed methods allows applying a surface texture with recesses and protuberances on top of a component surface of a process chamber component in any chosen way. Any of the aforementioned methods or processes allows directly applying textured features without the necessity of removing parts thereof as is the case with the methods known from the prior art.

In order to form the surface texture, it is advantageous if a surface texture material is provided.

Preferably, the surface texture material is provided in the form of at least one metal or a metal composition. A metal composition can, in particular, be provided in the form of a metal alloy. Such surface texture materials are well suited for forming textured features on at least one component surface of a process chamber component made from a metal such as, for example, stainless steel, titanium, and aluminium.

Favorably, the at least one metal is provided in the form of titanium, aluminium or stainless steel. These metals can be easily applied to a component surface by means of an additive manufacturing process or method.

Advantageously, the surface texture material is provided in the form of a powder and the powder is applied to the at least one component surface by local heating and melting. Forming the surface texture from a powder allows manufacturing the surface texture by, for example, powder bed technology or laser additive construction. Both methods use a laser or electron beam for heating and melting the texture material locally in order to form the surface texture. In particular, a powder stream directed to the at least one component surface is heated and melted with a laser beam focused on the powder hitting the surface to be coated.

Preferably, the surface texture is formed by applying at least one three-dimensional element to the component surface. The three-dimensional element can be formed in one piece or, for example, by adding one layer on top of another layer so as to form the three-dimensional element with a layered structure.

In accordance with a preferred embodiment of the invention, the at least one three-dimensional element is formed as a projection extending parallel or transversely with respect to the at least one component surface. This allows forming projections in the form of pins or mushroom-like elements. Further, it is also possible to form lines in the form of beads, strips or strings with an arbitrary cross section. For example, the cross section may be circular, oval or any combination thereof. In particular, several oval lines or beads may be applied one on top of the other.

Preferably, a plurality of three-dimensional elements is formed on the at least one component surface. In particular, the plurality of three-dimensional elements may comprise a plurality of lines connected to or crossing each other. Thus, a plurality of three-dimensional elements such as, for example, recesses, depressions or protuberances, can easily be formed.

A simple way of providing a surface texture on a process chamber component is to form the surface texture by applying at least one layer of the surface texture material to the at least one component surface. In particular, single lines or beads can be formed by applying a surface texture material to the at least one component surface. Of course, two, three or even more layers can be applied one on top of the other. A width or cross section of each layer can be equal or different so that increasing and decreasing cross sections in a direction parallel to the at least one component surface can be implemented.

Preferably, a plurality of layers is formed on the at least one component surface for forming a multi-layer surface texture. This alternative allows forming a more or less arbitrary shape or cross section of the surface texture. Layers of different thickness can be applied one on top of the other. In principle, it is also conceivable that the surface texture covers the at least one component surface completely.

Moreover, it is advantageous if the at least one three-dimensional element is formed by applying a plurality of layers on the at least one component surface. As already mentioned above, this allows providing increasing or decreasing cross-sectional widths of the at least one three-dimensional element.

Advantageously, at least one of the projection and the at least one layer is manufactured in the form of at least one of a strip or string. Such an improved method allows, in particular, the use of a special nozzle for applying a surface material in the form of a powder to the component surface and at the same time heating and melting the powder with a laser beam. Thus, any surface texture can be composed of a plurality of strips or strings which form beads or welding cords on the component surface.

Furthermore, well-defined surface textures may be easily formed if at least one of the projection and the at least one layer is manufactured so as to define an oval or substantially oval cross section. In particular, pancake-like stacks may be formed, as seen in a cross-sectional view.

In order to form at least one three-dimensional element with an arbitrary height with respect to the component surface it is advantageous if the plurality of layers is applied by forming one layer above the other. In particular, if a layer thickness is limited by the type of the additive manufacturing method used to apply the surface texture to the process chamber component a desired thickness can be implemented by applying a certain number of layers.

Preferably, the strings are applied in at least one of zigzag, straight, circle and wavelike formations. All these forms allow the formation of three-dimensional structures defining recesses or depressions that are delimited by at least one string or strip. In particular, two zigzag strings may be connected to each other forming rectangular or square surface texture elements as seen from above.

In accordance with a further preferred embodiment of the invention, it is suggested that each of the strings or layers applied one on top of the other for forming a three-dimensional element has a width in a direction parallel or substantially parallel to the at least one component surface and that the strings or layers are applied with constant or increasing width with an increasing distance of the respective string or layer from the component surface. This approach allows forming three-dimensional structures with increasing widths in dependence upon a distance of the respective layer from the component surface. Thus, recesses can be formed having a minimum opening width or opening cross section forming a cavity having a greater width or cross section closer to the component surface. This allows retaining sprayed particles in a substrate processing chamber in order to avoid undesired contamination of a substrate or wafer built or constructed in the substrate processing chamber.

In order to easily form cavities or recesses with a neck-like opening having or defining the smallest cross section of it, it is advantageous if the at least one three-dimensional element is made with a cross section in the form of a mushroom or substantially of a mushroom. A mushroom in this sense is any structure having a base connected to the component surface, which base is thinner than the top of the three-dimensional element. A cross section in this sense does, in particular, define a cross section in a plane which is perpendicular or substantially perpendicular or with an angle with respect to the at least one component surface on which the at least one three-dimensional element is formed.

Further, it is preferred if the at least one recess is formed with an increasing recess cross section in a direction towards the at least one component surface so as to define a cavity with a reduced entrance opening. As explained above, such a cavity easily retains any sprayed particles resulting from chemical vapor deposition (CVD) or physical vapor deposition (PVD), sputtering or plasma edging performed in the substrate processing chamber for texturizing a substrate in order to build or construct, for example, a wafer, chip or die.

Further, according to a further embodiment of the invention, a method of fabricating a process chamber component in the form of an annular shield element for use in a substrate process chamber which is designed for manufacturing wafers, chips or dies, is provided, the method comprising: providing an annular process chamber component structure defining at least one component surface and forming a surface texture on the at least one component surface as described above in connection with any one of the preferred methods of forming a surface texture on a process chamber component for use in a substrate processing chamber.

Providing such an improved method of fabricating a process chamber component in the form of an annular shield element for use in a substrate processing chamber also has the advantages outlined above in connection with preferred embodiments of the method of forming a surface texture on a process chamber component. In particular, the term annular is to define an element having an opening so that the element forms a closed ring-shaped structure.

In a further embodiment of the invention a method of refurbishing a process chamber component in the form of an annular shield element for use in a substrate processing chamber which is designed for manufacturing wafers, chips or dies is provided, the method comprising: providing a used annular process chamber component with a contaminated, damaged and/or aged surface texture, removing the surface texture so as to obtain an annular process chamber component structure having a component surface defining at least one component surface, and forming a surface texture on the at least one component surface as described above in connection with preferred embodiments of the method of forming a surface texture on a process chamber component for using a substrate processing chamber.

Such a refurbishing method also has the advantages outlined above in connection with preferred embodiments of the method of forming a surface texture on a process chamber component. In particular, this method can include removing all particles retained by and within the surface texture and adhering to the component surface not covered by the surface texture. Thus, any used process chamber component contaminated with excess spray particles of a fabrication process conducted in the substrate processing chamber may be completely removed so that preferably the original component structure is obtained. As already outlined above, this refurbishing method generally allows unlimited reuse of the process chamber component by adding a surface texture on top of the component surface and removing the same after a certain operating time of the substrate processing chamber. It should be noted that if the process chamber component is overloaded with excess particles it may be cleaned using chemicals in order to remove the excess particles from the process chamber component. However, after a certain number of cycles of cleaning and use, the process chamber component, which is aged due to cleaning and sputtering steps, may be refurbished by removing the complete surface texture by machining.

Preferably, the surface texture is removed without modifying or damaging the at least one component surface. This allows a generally unlimited reuse of the process chamber component if it is refurbished on a regular basis as described above since the at least one component surface remains the same, i.e., it is not modified by this refurbishing method.

Further, the invention relates to a process chamber component in the form of an, in particular annular, shield element for use in a substrate processing chamber which is designed for manufacturing wafers, chips or dies, the process chamber component having an annular process chamber component structure defining at least one component surface, a surface texture being arranged on the at least one component surface and having at least one recess, the total surface area defined by the surface texture is greater than the total surface area defined by the at least one component surface, wherein the surface texture is applied to the at least one component surface by additive manufacturing.

As outlined above in connection with the method of forming a surface texture on a process chamber component, such an improved process chamber component can be easily made by a single process since, in contrast to process chamber components known from the prior art the surface texture forming does not require coating the component surface in a first step and then texturizing the coating. With a single additive manufacturing process the surface texture can be made. This is faster, easier and can be cheaper. Moreover, as already described, too, such a process chamber component can be easily refurbished by removing the surface texture and any particles contaminating the surface texture and/or the component surface during use thereof. Thus, the at least one component surface can remain completely unmodified so that generally unlimited refurbishing of the process chamber component is conceivable. Furthermore, the proposed improved process chamber component has a significant greater durability and a longer service life as compared with process chamber components texturized with an electron beam.

Preferably, the surface texture only partially covers the at least one component surface. Such a surface texture has the advantage that it can be applied with a minimum amount of surface texture material. In other words, at least one recess or depression defined by the surface texture can be bordered or delimited at least partially by the component surface. Depending on the type of additive manufacturing the only partial covering of the at least one component surface by the surface texture is that the surface texture can be formed even quicker than providing a coating of the at least one component surface first and then texturizing the same with an electron beam.

Advantageously, the surface texture is applied so as to form the at least one recess in the form of an opening which allows direct access to the at least one component surface. For example, the surface texture can define a plurality of ring structures bordered or delimited by the at least one component surface.

Furthermore, it is preferred if the surface texture is applied to the at least one component surface without modifying or damaging the at least one component surface. In other words, the surface texture sticks or adheres to the component surface so that the component surface is not modified or damaged at all. This allows an easy refurbishing of the process chamber component by completely removing the surface texture without the necessity of damaging or partially removing a portion of the process chamber component as is the case with process chamber components disclosed in the prior art.

Preferably, the surface texture is made by at least one of 3D printing, selective laser sintering, direct metal deposition and laser additive manufacturing. The aforementioned additive manufacturing methods can easily be identified by the inner structure of the surface texture, in particular, by the structure of the surface texture and its composition. Each of these methods characteristically modifies a surface texture material from which the surface texture is made of.

It is advantageous, if the surface texture is made from a surface texture material. The surface texture material can, in particular, be the same material as the material from which the process chamber component is made of. However, the process camber component can be made of a material which is different from the surface texture material.

Preferably, the surface texture material is at least a metal or a metal composition. For example, the metal composition can be in the form of a metal alloy.

A three-dimensional surface texture can be easily made if the at least one metal is titanium, aluminium or stainless steel.

The surface texture material is preferably in the form of a powder applied to the at least one component surface by local heating and melting. Due to the local heating and melting of the powder, the surface texture has a certain inner structure which is characteristic of the manufacturing method. This allows easily distinguishing of surface textures made by an additive manufacturing method compared to surface textures made by electron beam texturizing.

In accordance with a preferred embodiment of the invention, the surface texture comprises at least one three-dimensional element formed on the component surface. The three-dimensional element increases the total surface area of the process chamber component, which allows adhering excess particles occurring during the use of a substrate processing chamber.

A surface texture can be easily made if the at least one three-dimensional element is designed as a projection extending parallel and transversely with respect to the at least one component surface. The three-dimensional element can, in particular, be in the form of a bead extending parallel to the at least one component surface. However, it can also have the shape of a projecting pin or mushroom-like element.

In order to significantly increase a total surface area of the process chamber component, it is advantageous if the surface texture comprises a plurality of three-dimensional elements on the at least one component surface.

Preferably, the surface texture is formed by at least one layer of the surface texture material. Such at least one layer is, of course, formed by additive manufacturing. It is possible, to apply two, three, four or even more layers one on top of the other in order to form the surface texture and/or the at least one three-dimensional element.

Moreover, a thickness of the surface texture can be easily adjusted if the surface texture comprises a plurality of layers forming a multi-layer surface texture. It is also possible in so doing that, in particular, a width of each layer may be altered in dependence upon a distance of the respective layer from the at least one component surface.

Three-dimensional elements with an arbitrary height with respect to the at least one component surface can be easily implemented if the at least one three-dimensional element comprises a plurality of layers. For example, a height of the least one three-dimensional element can be customized in discrete steps by a discrete number of layers.

The process chamber component can be easily manufactured if at least one of the projection and the at least one layer is designed in the form of at least one of a strip or string. Such a string can also be called a bead which has a varying width parallel to the at least one component surface in a cross-sectional view in a plane perpendicular to the at least one component surface.

Preferably, at least one of the projection and the at least one layer has an oval or substantially oval cross section. This allows forming a multi-layer three-dimensional element having the shape of a pancake stack in a cross sectional view.

Although it is conceivable that the plurality of layers is formed one next to the other for covering the at least one component surface completely, it is advantageous if the plurality of layers is arranged one layer above the other. This allows the forming of at least one three-dimensional element having a multi-layer structure.

In order to further facilitate the manufacture of the process chamber component, it is advantageous if the strings are applied in at least one of zigzag, straight, circle and wavelike formations. It is also possible to call the strings beads or strips. Such a design allows a continuous application of the surface texture with a minimum of starts and stops of the additive manufacturing process for forming the surface texture.

Preferably, each of the strings or layers arranged one on top of the other and forming a three-dimensional element has a width in a direction parallel or substantially parallel to the at least one component surface and the strings or layers have a constant or increasing width with increasing distance of the respective string or layer from the component surface. Such a design can be used for forming cavities which are partially delimited or bordered by the surface texture and partially by the component surface. Such cavities can have an opening pointing away from the component surface which has a cross section in the vicinity of the entrance of the cavity, i. e. the opening, which is smaller than inside the cavity. Such a design has improved properties for retaining excess particles which are inevitably generated during the manufacture of an wafer, chip or die on a substrate.

Preferably, the at least one three-dimensional element has a cross section in the form of a mushroom or substantially of a mushroom. The main characteristic of a mushroom-like shape is that the three-dimensional element has a thinner base connected with the component surface and a wider umbrella-like top further away from the at least one component surface.

Moreover, it is advantageous if the at least one recess has an increasing recess cross section in a direction towards the at least one component surface so as to define a cavity with a reduced entrance opening. Such a design of the surface texture provides improved adherent properties for retaining excess particles in the substrate processing chamber, which could contaminate a substrate on which a wafer, chip or die is constructed or built.

Preferably, the process chamber component defines a longitudinal axis and is designed rotationally symmetric or substantially rotationally symmetric with respect to the longitudinal axis. Such a process chamber component may be of annular shape, and can be made, in particular, in the form of a ring or sleeve, and thus can advantageously be used as a shield element in a substrate processing chamber, in particular, a physical vapor deposition substrate processing chamber.

It is advantageous, if the process chamber component has an outer surface section pointing away from the longitudinal axis and if the outer surface section is at least partially, in particular completely, bearing or supporting the surface texture. Such a process chamber component can easily adhere and retain excess particles in the substrate processing chamber. Providing the surface texture on the outer surface section of the process chamber component allows for adhering excess particles even then when they have left an inner space defined by a shield arrangement of the substrate processing chamber. This avoids contaminating inner walls of the substrate processing chamber with excess particles. Further, providing the surface texture on the outer surface section of the process chamber component allows for capturing or trapping particles temporarily adhered to the inner walls of the substrate processing chamber but returning towards the substrate. The process chamber component thus forms a shield protecting the substrate from being contaminated.

In order to easily adhere excess particles on the process chamber component, it is preferred, if the outer surface section extends concentrically or substantially concentrically or concave or convex or concavo-convex with respect to the longitudinal axis. Such shapes of the outer surface section improve adherence of excess particles depending on the shape of the substrate processing chamber.

Further, it is preferred if the process chamber component has an inner surface section pointing toward the longitudinal axis and if the inner surface section is at least partially, in particular completely, bearing or supporting the surface texture. Such a design allows for adherence of excess particles not reaching the substrate or being deflected from the substrate.

In order to optimize adherence of excess particles by the process chamber component it is advantageous if the inner surface section extends concentrically or substantially concentrically or concave or convex or concavo-convex with respect to the longitudinal axis.

Moreover, it is advantageous if the process chamber component has a transverse section extending transversely, in particular perpendicularly, with respect to the longitudinal axis and if the transverse section is at least partially, in particular completely, bearing or supporting the surface texture. Such a design is especially advantageous for coverings of a shield arrangement of a PVD substrate processing chamber, which coverings are arranged for covering connecting areas of two process chamber components of the shield type.

In order to improve adherence of excess particles on the process chamber component, it is preferred if the transverse surface section extends planar or substantially planar or concave or convex or concavo-convex.

Preferably, the process chamber component has a through-opening along the longitudinal axis. Such a design of the process chamber component allows for arranging the latter in a substrate processing chamber so as to surround the substrate which is to be texturized for producing a wafer, a chip or a die.

In accordance with a preferred embodiment of the invention, the process chamber component defines a maximum outer radius with respect to the longitudinal axis, the through-opening defines a maximum inner radius with respect to the longitudinal axis, and the maximum inner radius is at least twice as large as a difference between the maximum outer radius and the maximum inner radius. Such a process chamber component allows for defining a rather large inner space delimited, in particular, by an inner surface section of the process chamber component. In particular, choosing the dimensions of the process chamber component as suggested allows for, in particular, designing the substrate processing chamber component having an annular structure in the form of sleeve or tube which is well-suited for forming a barrier for excess particles in the substrate processing chamber in order to prevent contamination of the substrate to be texturized by capturing excess particles.

In order to mount the process chamber component in the substrate processing chamber quickly and easily, it is advantageous if the process chamber component has at least one fastening opening, in particular a plurality of fastening openings, for receiving a fastening element. The at least one fastening opening may, in particular, be made in the form of a bore or a recess or the like for, in particular, receiving fastening elements in the form of screws. Further, the at least one fastening opening may, in particular, be provided with threads.

Further, it is preferred if the process chamber component forms part of a shield arrangement of a substrate processing chamber which is designed for manufacturing wafers, chips or dies, and if the process chamber component is designed in the form of a cover ring, a cup outer feed support, a deposition ring, an inner shield, a lower shield, or an upper shield of the shield arrangement. This allows for, in particular, providing the advantageous surface texture on some or even all parts of the shield arrangement.

The invention further relates to a process kit for a substrate processing chamber, the process kit comprising at least one, in particular a single, shield element, in particular in the form of a ring, adapted to at least partially surround a substrate in the processing chamber, wherein the at least one shield element is in the form of one of the above-outlined preferred embodiments of a process chamber component. Such a shield element provided in the form of a process chamber component with a surface texture made by additive manufacturing can be easily designed and made with adherent properties for optimizing the retaining of excess particles in a substrate processing chamber. In particular, the shield element may be formed as a ring or the like.

The invention further relates to a substrate processing chamber comprising at least one of the above-identified preferred embodiments of a process chamber component or a preferred embodiment of the above-outlined process kit.

Providing such a substrate processing chamber has the advantages outlined above in connection with preferred embodiments of process chamber components.

And finally, the invention relates to the use of a method of forming a surface texture on a process chamber component for use in a substrate processing chamber in accordance with one of the above-identified preferred embodiments for manufacturing a process chamber component as defined above in connection with the described preferred embodiments.

FIG. 1 shows a diagrammatic sectional view through a portion of a process chamber component 10 known from the prior art. The process chamber component 10 has a component structure 12 with an outer surface 14.

The process chamber component 10 has a surface texture 16 comprising a plurality of recesses 18 and protuberances 20, which are formed by scanning an electron beam 22 over the outer surface 14 of the process chamber component 10. The electron beam 22 locally heats and melts the material from which the process chamber component 10 is made so that the recesses 18 form cavities 24 with an entrance opening having a width 28 that is smaller than a maximum width 30 of the cavity 24.

Providing the surface texture 16 on the outer surface 14 of the process chamber component 10 modifies the process chamber component 10 at least partially. Reusing such a process chamber component 10 is generally possible. However, for refurbishing such a process chamber component 10 the surface texture 16 has to be removed, for example, by machining the process chamber component 10 above the dotted line 32. Such a refurbishing process reduces a thickness of the process chamber component 10 with each machining process so that the reuse of the process chamber component 10 after refurbishing is limited to a certain number of use cycles.

Figure 2:
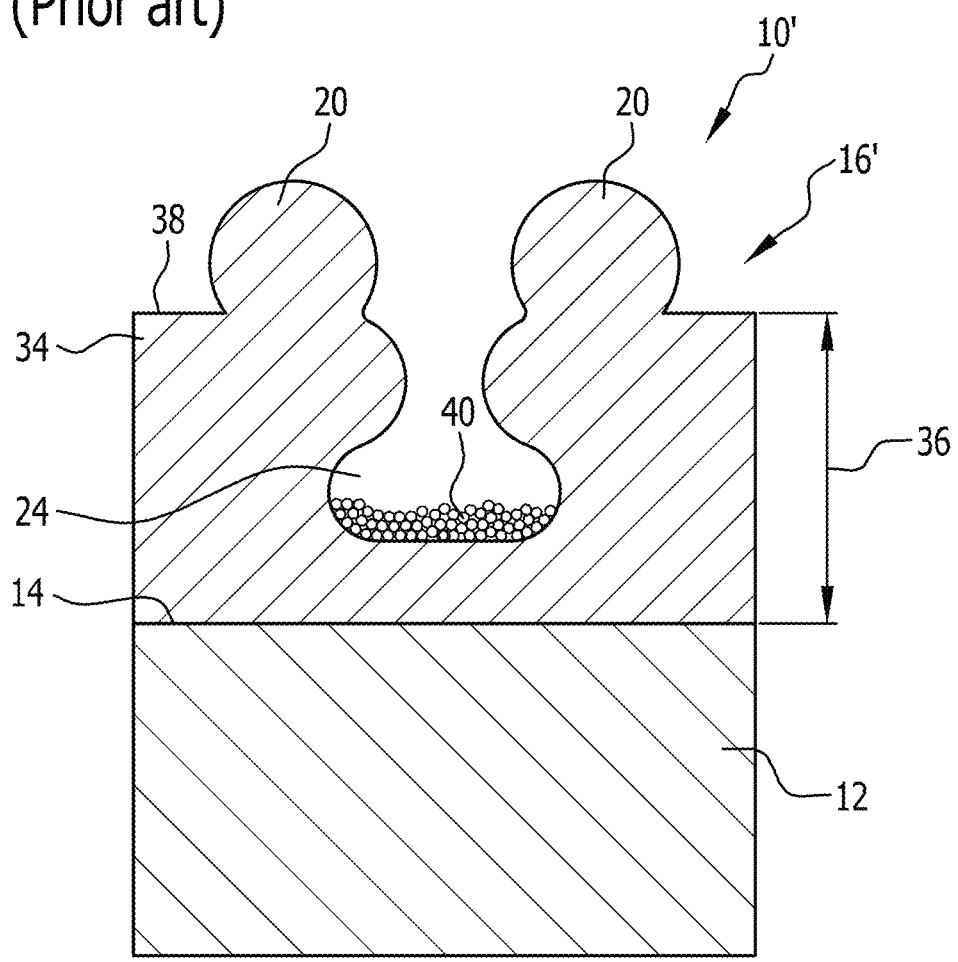
FIG. 2 shows a cross-sectional view of a process chamber component with a complete coating thereof is texturized by electron beam texturizing.

A further diagrammatic representation of a sectional view of a further embodiment of a process chamber component 10' is shown in FIG. 2. Such a process chamber component 10' is also known from the prior art.

The component structure 12 is provided with a coating 34 which completely covers the outer surface 14 of the component structure 12. A plurality of cavities 24 are formed with an electron beam. The coating 34 has a thickness 36. A surface texture 16' is formed in the coating 34 so that a plurality of cavities and protuberances 20 are formed. The protuberances 20 extend beyond an outer surface 38 of the coating 34.

Both the cavities 24 of process chamber component 10 and process chamber component 10' serve as a kind of trap for retaining excess particles 40 generated in a substrate processing chamber when a substrate, in particular, for forming a wafer, chip or die undergoes a physical vapor deposition process or a chemical vapor deposition process. The process chamber component 10 is typically arranged around the substrate in the processing chamber so as to prevent the excess particles 40 from contaminating the substrate.

Figure 3:
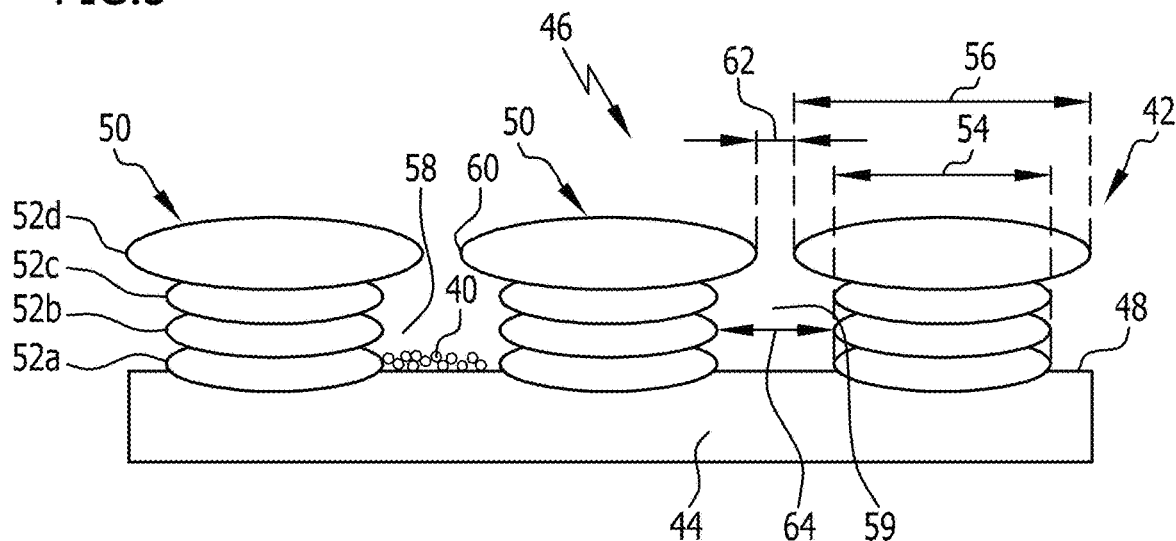
FIG. 3 shows a diagrammatic representation of a surface texture in accordance with the invention formed on a process chamber component.

FIG. 3 is a diagrammatic side view or sectional view of a surface texture 42 provided on a component structure 44 forming a process chamber component 46 in accordance with the invention.

The component structure 44 may be of any suitable form and shape for being arranged in a substrate processing chamber. It has a component surface 48.

The surface texture 42 is formed on top of the component surface 48 by additive manufacturing, in particular, by 3D printing, selective laser sintering, direct metal deposition or laser additive manufacturing.

The surface texture 42 comprises three-dimensional texture elements 50 which have a multi-layer structure. Each texture element 50 as schematically shown in FIG. 3 consists of four layers 52a, 52b, 52c and 52d.

Layer 52a is directly applied to the component surface 48. Layer 52b is applied on top of layer 52a. Layer 52c is applied on top of layer 52b. Top layer 52d is applied on top of layer 52c. A width 54 of layers 52a, 52b and 52c is approximately constant. A width 56 of top layer 52d is larger than width 54.

The layers 52a, 52b, 52c and 52d can, in particular, be formed as lines. Thus, a cavity 58 or recess 59 is formed, which is delimited or bordered by at least two texture elements 50 and a remaining uncovered portion of the component surface 48.

Due to the width 56 being greater than the width 54, an entrance opening 60 delimited by the layer 52d has a width 62 which is significantly smaller than a width 64 defined by corresponding layers 52a, 52b and 52c of two texture elements 50 arranged next to each other. The cavity 42 has therefore a greater cross section than in the area defined by the opening 60. Thus, excess particles 40 can be easily retained or trapped between the texture elements 50.

Figure 4:
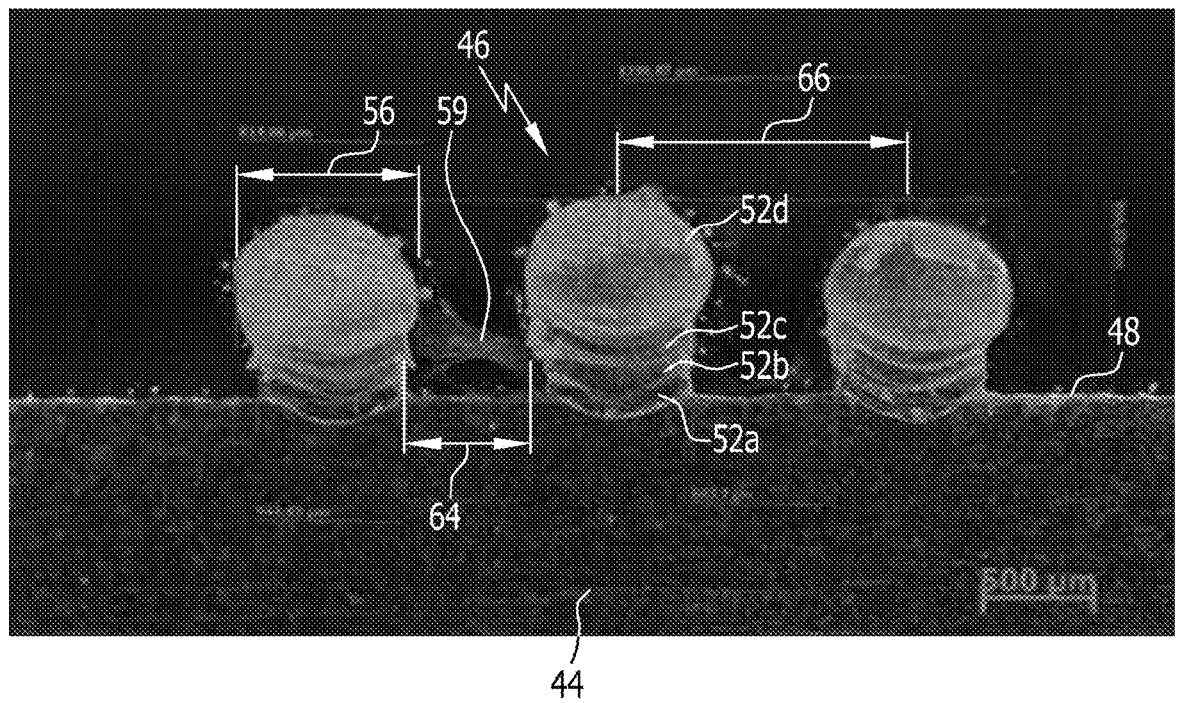
FIG. 4 shows a microscope image of an arrangement of three three-dimensional elements formed on a process chamber component.

FIG. 4 shows a microscope image of a sectional cut through a process chamber component 46. The generally arbitrary component structure 44 has a component surface 48 on which three texture elements 50 are formed. Their shape corresponds substantially to the shape of the texture elements 50 schematically shown in FIG. 3.

The three texture elements 50 have a multi-layer structure and also consist of four layers 52a, 52b, 52c and 52d. The width 64 of top layer 52d is approximately 810 μm. The scale of this photograph is indicated on the right bottom corner of the image. A distance 66 between a center of two texture elements 50 arranged next to each other is approximately 1300 μm. The width 64 is approximately 640 μm.

Figure 5:
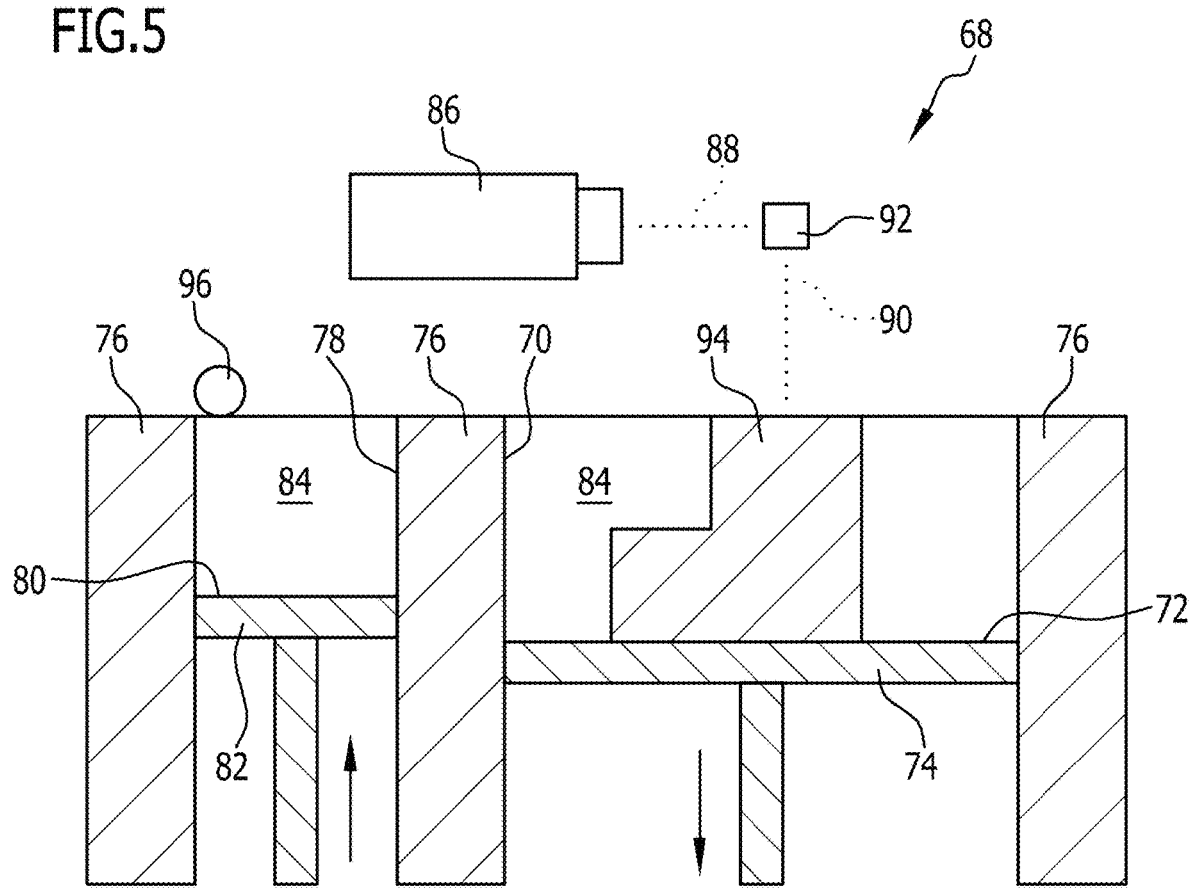
FIG. 5 shows a diagrammatic representation of an additive manufacturing apparatus.

FIG. 5 shows one alternative for an additive manufacturing apparatus. It is based on the so-called powder bed technology.

The apparatus 68 comprises a building chamber 70 having a bottom 72 defined by the upper side of a movable building platform 74. The bottom 72 and side walls 76 define the building chamber 70. The building chamber 70 is open at its top side.

A powder chamber 78 is arranged next to the building chamber 70. It has also a bottom 80 defined by a movable platform 82.

The powder chamber 78 is also defined by surrounding side walls 76 and the bottom 80. The powder chamber 78 is filled with a texture material 84 in powder form.

The apparatus 68 further comprises a laser 86 for emitting laser radiation in the form of a laser beam 90 which can be deflected across the top surface of the building chamber 70 by means of a deflection device 92.

A three-dimensional object 94 can be manufactured, starting with the platform 74 in its most upward position carrying a single layer of the texture material 84 in powder form.

By scanning the laser beam 90 across this powder layer, the powder is heated and melts and thus forms a solidified layer of the object 94. After the first layer of the object 94 to be built has solidified, the platform 74 is moved downwards parallel to the direction of gravity for a distance which corresponds to the thickness of one layer of the object 94.

The platform 82 is moved upwards in a direction opposite the direction of gravity so that part of the texture material 84 located in the powder chamber 78 escapes from the powder chamber 78. A roller 96 moves this escaped powder over the side wall 76 separating the building chamber 70 and the powder chamber 78 and fills the gap on top of the building chamber 70 resulting from the downward movement of the platform 74. Thus, the building chamber 70 is again completely filled with powdered texture material 84.

In a next step, the laser beam 90 can be scanned across the top layer of the powdered texture material 84 for solidifying the same as described above.

This process is continued to form the three-dimensional object 94 by forming one solidified layer on top of the other.

The three-dimensional object 94 can be of any shape. In particular, it can be used to manufacture a surface texture 42 as shown in FIGS. 3 and 4 on top of a component structure 44. For doing so, the component structure 44 is arranged on the platform 74 and the surface texture 42 is built as described for the object 94 in connection with FIG. 5.

Figure 6:
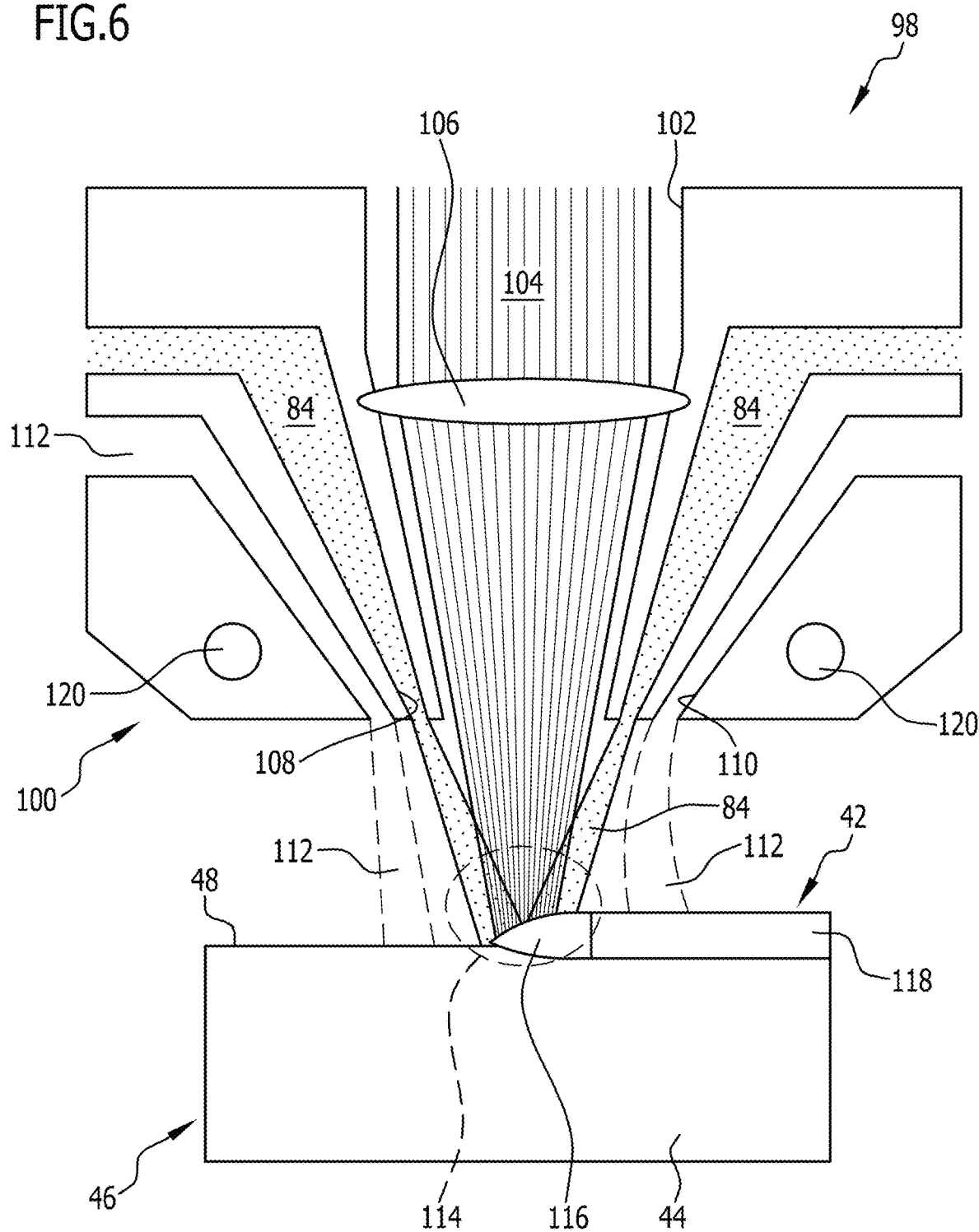
FIG. 6 shows a diagrammatic cross-sectional view of part of an alternative embodiment of an additive manufacturing apparatus.

An alternative way of producing a surface texture 42 on top of a component structure 44 is diagrammatically shown in FIG. 6. It is an example for laser additive manufacturing also known as laser cladding.

FIG. 6 shows an essential part of an apparatus 98 for laser additive manufacturing by laser cladding.

FIG. 6 shows a cross-sectional view through a nozzle 110 having a central confined opening 102 through which a laser beam 104 is focused by a lens 106 on the component surface 48 also called the building plane. A conical nozzle opening 108 surrounds opening 102 concentrically. It is provided for applying the texture material 84 in the form of a powder to the component structure 44. A further conical nozzle opening 110 concentrically surrounds the nozzle opening 108. It is used for applying a shroud gas for shielding the welding zone 114 represented by a dotted line in FIG. 6.

The laser beam 104 melts the powdered texture material 84 so that hot liquid texture material 186 is formed in the welding zone 114. As the nozzle 100 moves over the component surface 48, the texture material 116 cools down and solidifies in the form a welding bead 118 for forming a layer of the surface texture 42.

The nozzle 100 further comprises at least one cooling channel 120 surrounding the nozzle opening 110 through which a cooling liquid is guided in order to avoid any damage to the nozzle 100 due to the high temperatures in the welding zone 114.

Generally, both technologies described in connection with FIGS. 5 and 6 can be used for forming a surface texture in accordance with the invention. However, the powder bed technology described in connection with FIG. 5 currently has a drawback as possible dimensions are limited. In contrast thereto, there is generally no limitation regarding dimensions for laser cladding.

The texture material is preferably titanium, aluminium or stainless steel. It can also be a mixture of different metals or a powder of a metal alloy.

The powder has an average grain size of from about 30 µm to about 70 µm with a spherical shape, preferably about 60 µm.

The component structure 44 is also preferably made from a metal or a metal composition such as, for example, stainless steel, aluminium or titanium. Any metal composition or alloy is also conceivable.

Figure 7:
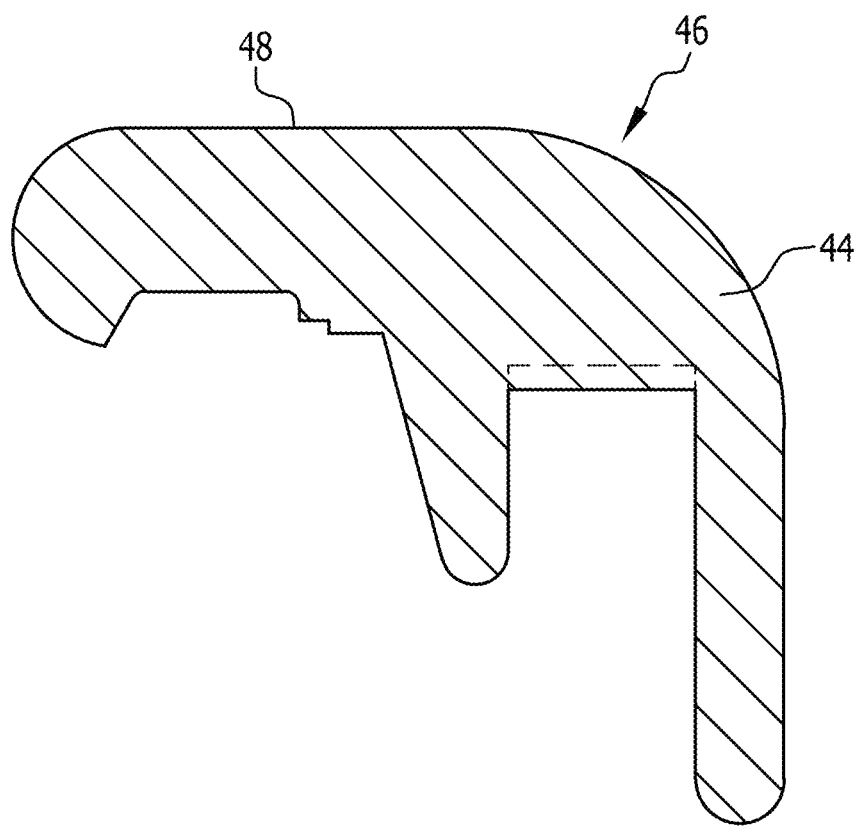
FIG. 7 shows a cross-sectional view of a process chamber component.

FIG. 7 shows a cross-sectional view through a component structure 44 of a process chamber component 46. It can generally be of any form. Preferably, the component structure 44 defines a ring.

The component structure 44 has a component surface 48 to which a surface texture can be applied.

Figure 8:
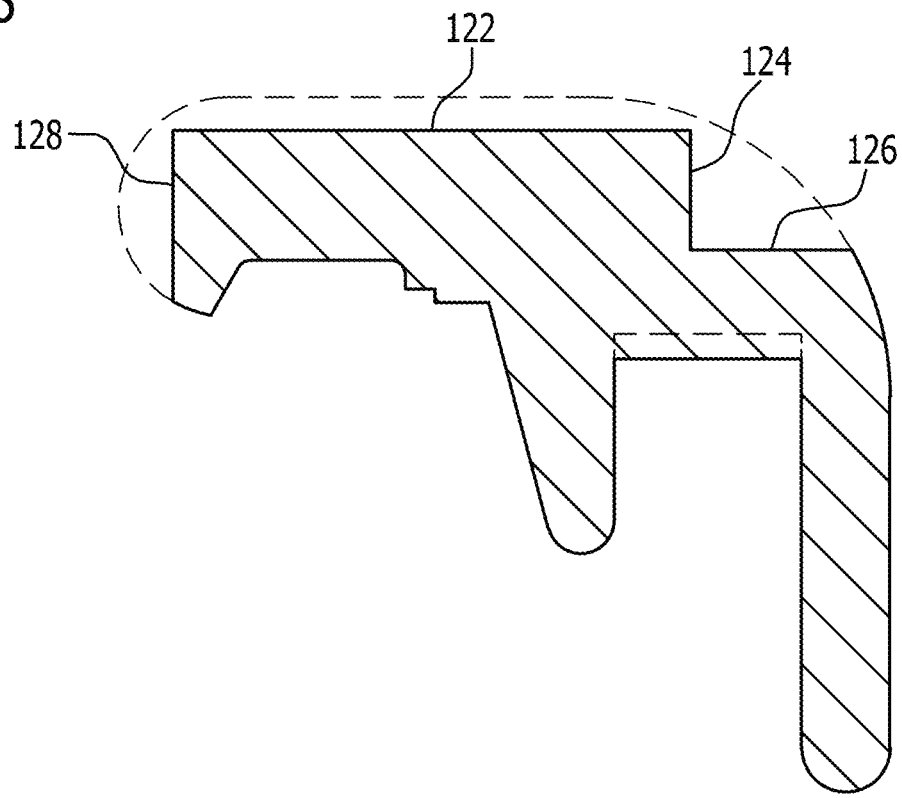
FIG. 8 shows a cross-sectional view of the process chamber component of FIG. 7, which is partially machined.
Figure 9:
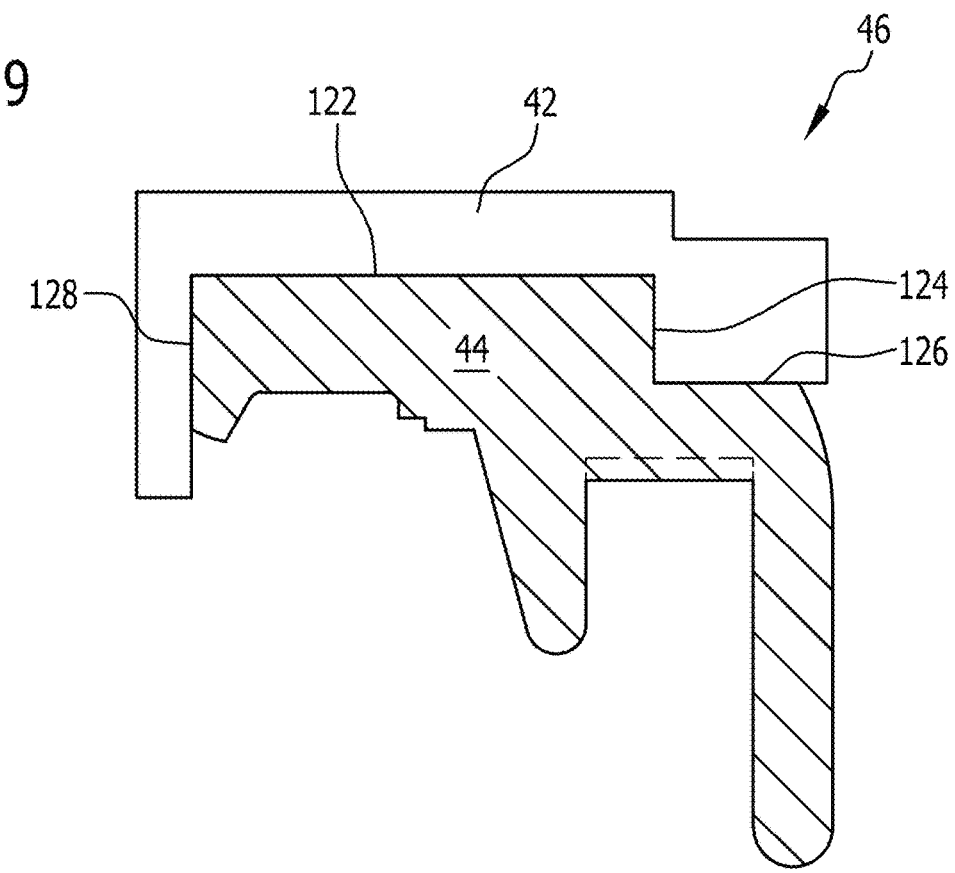
FIG. 9 shows a sectional view of the process chamber component of FIG. 8 with an additional surface coating.

For providing a well-defined surface 122, the component surface 48 may be partially machined for forming surfaces 122, 124, 126 and 128, which define planes extending perpendicular or parallel to each other as shown in FIG. 8. Or, as an alternative, the component structure 44 may be originally provided as shown in FIG. 8 so that no machining is required before applying the surface texture 42.

In a next step, surfaces 122, 124, 126 and 128 can be covered with a surface texture 42 as described above. It should be noted that surfaces 122, 124, 126 and 128 can be completely covered by the surface texture 42.

After a certain number of use cycles, the surface texture 42 can be easily removed without modifying any of the surfaces 122, 124, 126 and 128. Thus, the process chamber component 46 can be refurbished in a well-defined manner.

Since the surface texture 42 is applied to the component structure 44 without modifying the same, there is generally no limitation for the number of refurbishing cycles for such a process chamber component 46.

Figure 10:
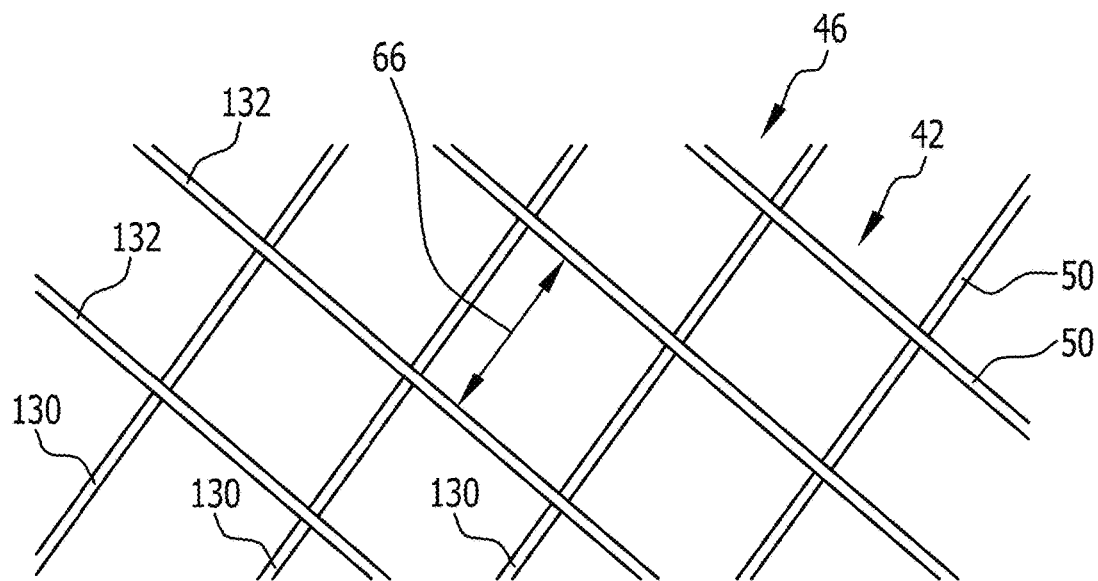
FIG. 10 shows a diagrammatic representation of a detail of a surface texture formed by intersecting lines.

FIG. 10 shows a diagrammatic detail of a top view of a process chamber component 46 on which a surface texture 42 is formed.

The surface texture 42 comprises a plurality of texture elements 50 which are formed by straight lines. The texture elements 50 comprise a plurality of parallel strings 130. Furthermore, a plurality of parallel strings 132 are provided. The strings 130 and 132 are arranged so as to cross each other substantially perpendicularly.

A distance 66 between strings 130, on the one hand, and also between strings 132, on the other hand, is preferably about 1000 µm. Depending on the widths 54 and 56, the distance 66 can vary. Laser cladding allows a bead width in the range of from about 0.5 mm to about 15 mm. Therefore, the distance 66 is adapted accordingly in order to have a remaining gap between the texture elements 50 extending parallel to each other, in particular, between the top layers 52d of the texture elements 50 as shown and described in connection with FIG. 3.

Figure 11:
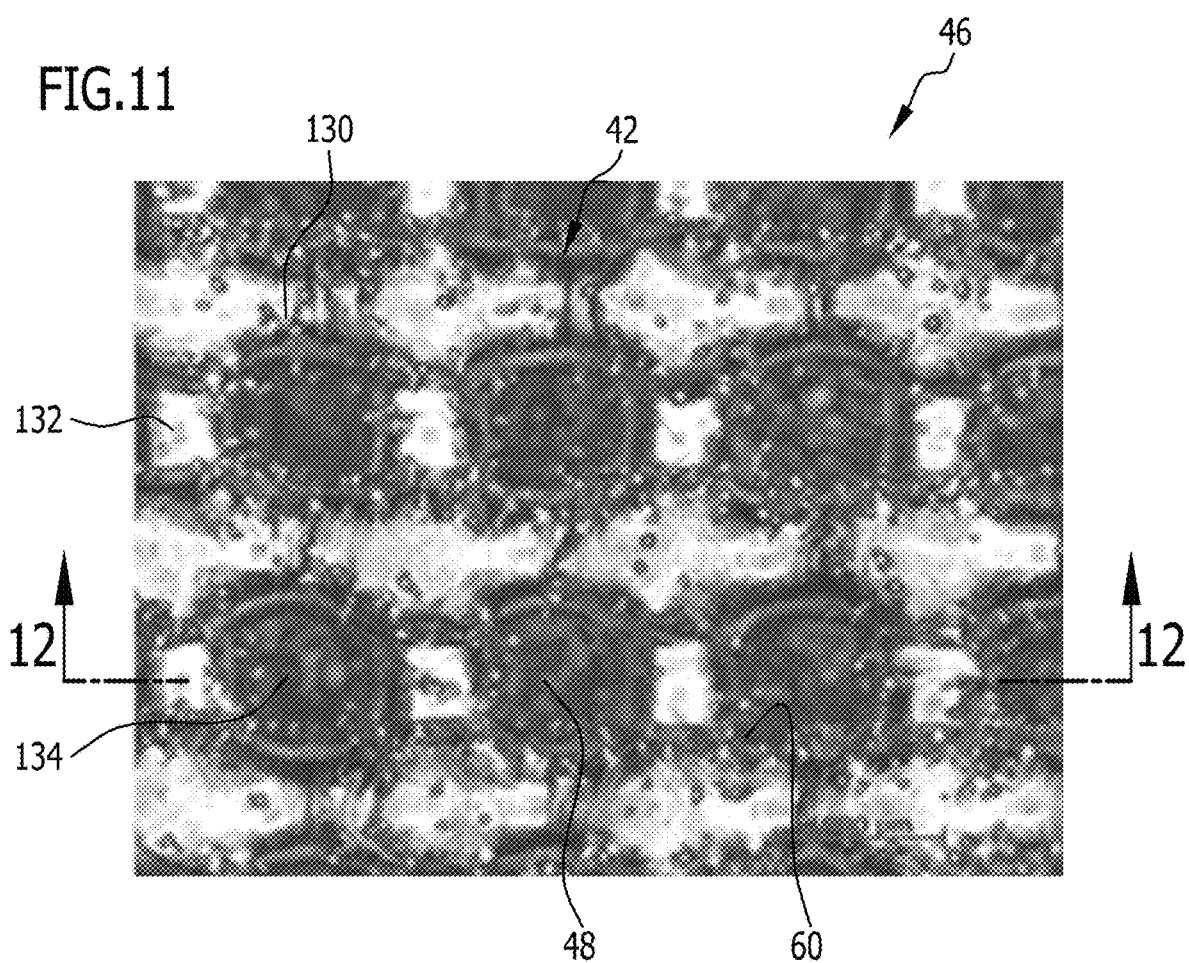
FIG. 11 shows a microscope image of a process chamber component with a surface structure formed by crossing lines.

FIG. 11 shows a microscope image of a detail of such a surface texture 42 with a plurality of strings 130 and 132 intersecting or crossing each other. The texture elements 50 are arranged such that recesses 134 are formed, which are bordered or delimited by two strings 130, two strings 132 and the component surface 48 which is visible in this top view. Also visible is the opening 60.

Figure 12:
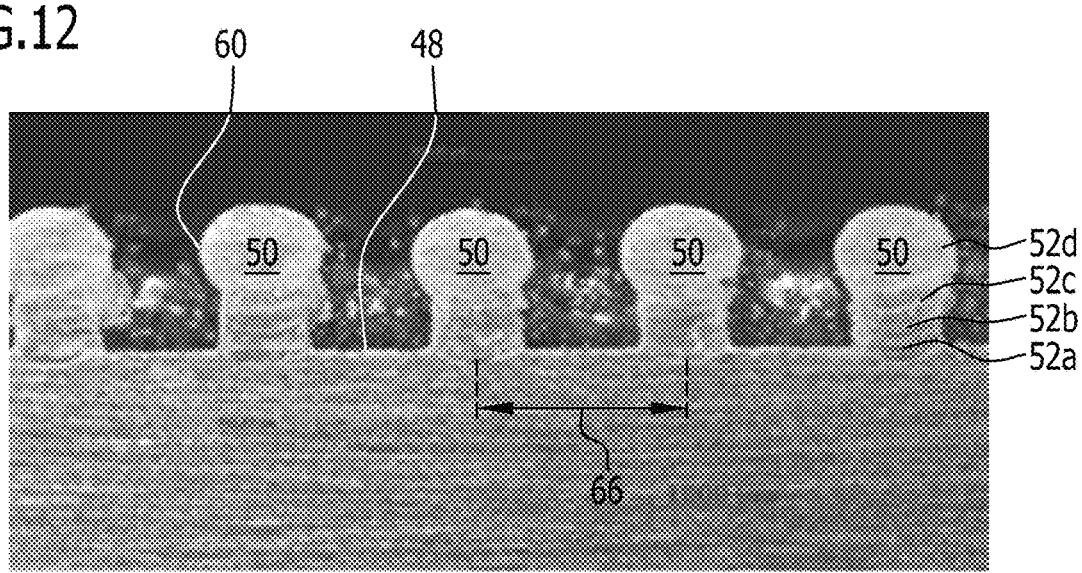
FIG. 12 shows a cross-sectional view along line 12-12 in FIG. 11.

FIG. 12 shows a sectional view through the process chamber component 46 shown in FIG. 11 along line 12-12. The scale is shown in the right bottom part of FIG. 12. A distance 66 between texture elements 50 arranged next to each other is approximately 1500 µm.

Each of the texture elements 50 consists of four layers 52a, 52b, 52c, and 52d.

The opening 60 is delimited by the top layers 52d and allows direct access to the unmodified component surface 48.

Figure 13:
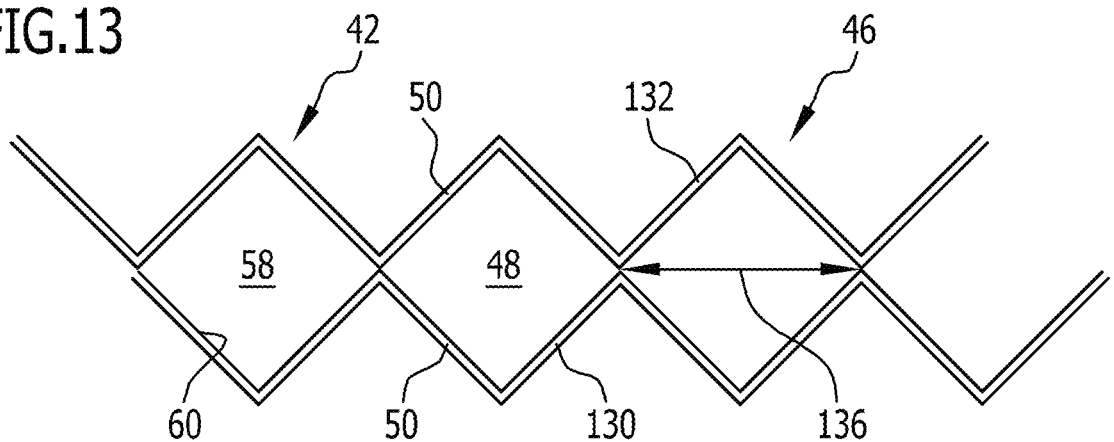
FIG. 13 shows a further diagrammatic representation of a further embodiment of a surface texture design for a process chamber component.

FIG. 13 diagrammatically shows an alternative arrangement of the texture elements 50. They are applied to the component surface 48 in a plurality of strings 130 and 132 which are arranged in zigzag. A distance between contact points of edges of strings 130, on the one hand, and strings 132, on the other hand, is in the range of from about 0.5 mm to 2 mm depending on the width of the respective string 130, 132.

The arrangement shown schematically in FIG. 13 also allows forming of openings 60 to cavities delimited by the strings 130 and 132 and the component surface 48.

Figure 14:
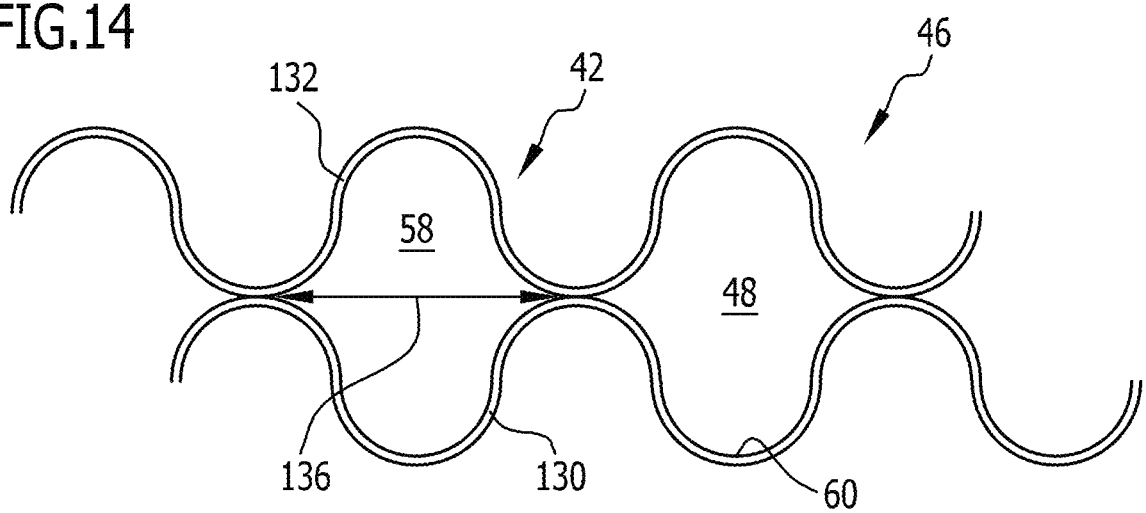
FIG. 14 shows a further diagrammatic representation of a further embodiment of a surface texture design for a process chamber component.

FIG. 14 shows a further diagrammatic top view of an embodiment of a process chamber component 46. The surface texture 42 is formed by a plurality of strings 130 and 132 which each have a wave form. The strings 130 and 132 contact each other in order to form openings 60 to cavities 58 delimited by the strings 130 and 132 and the component surface 48. A distance 136 between contact points of strings 130 and 132 is preferably in the range of from about 0.5 mm to about 2.5 mm. The distance 133 typically depends on the width of the respective strings 130 and 132.

The schematic arrangements in FIGS. 10, 13 and 14 are only shown by way of example. Other arrangements are conceivable for forming cavities 58 or recesses 59.

The width of the strings 130 and 132 in the sketches shown in FIGS. 10, 13 and 14 is not to scale. It should be noted that the width depends on the respective additive manufacturing process used for applying such surface textures 42 to the component structure 44. FIGS. 10, 13 and 14 are only used to show by way of example the orientation of the lines, in particular, whether the strings 130, 132 are of straight, zigzag, circle or wave-like formation.

Figure 15:
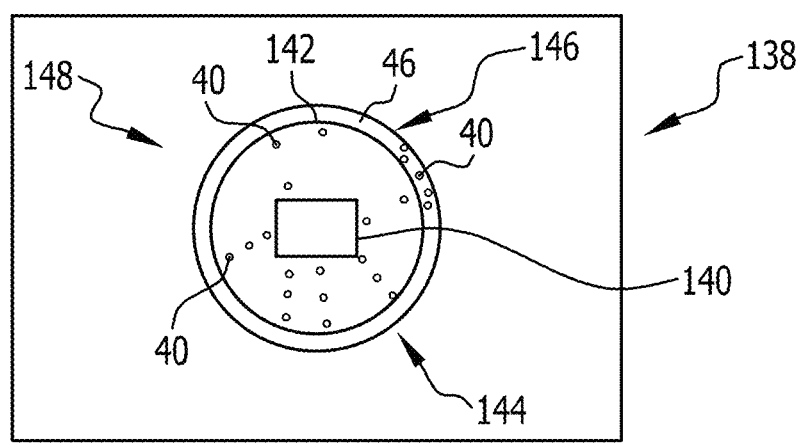
FIG. 15 shows a diagrammatic representation of a substrate processing chamber comprising a process kit comprising a ring in the form of a process chamber component.

FIG. 15 shows a diagrammatic sketch of a substrate processing chamber 138 with a substrate 140. The substrate 140 is surrounded by a process chamber component 46 in the form of a ring 142. The ring 142 forms part of a process kit 144 for the substrate processing chamber 138. It should be noted that any other designs of process chamber components 46 are conceivable which are suited as a protecting element as described further below. The process chamber component 46 is designed in the form of an annular shield element 146 which forms part of a shield arrangement 148 arranged to surround the substrate 140 for adhering excess particles 40.

The substrate 140 is used for manufacturing, for example, wafers, chips or dies. The substrate can be texturized by radiation and covered with layers of conducting and non-conducting materials. The substrate 140 may, in particular, be treated by physical vapor deposition (PVD) and/or chemical vapor deposition (CVD). Moreover, layers of material can also be sputtered onto the substrate 140.

The ring-shaped process chamber component 46 is used to retain excess particles 40 generated during treating of the substrate 140. In order to avoid contamination of the substrate 140 by such excess particles 40, the process chamber component 46 has to be exchanged from time to time. If the process chamber component 46 is overloaded with excess particles 40 it may be cleaned using chemicals in order to remove the excess particles 40 from the process chamber component 46.

After a certain number of loops of cleaning the process chamber component 46 as described, a new or refurbished process chamber component 46 can be used to replace the contaminated, damaged and/or aged process chamber component 46. For example, about ten cleaning cycles of the process chamber component 46 are possible until it may be refurbished by removing the complete surface texture 42 by machining.

Figure 16:
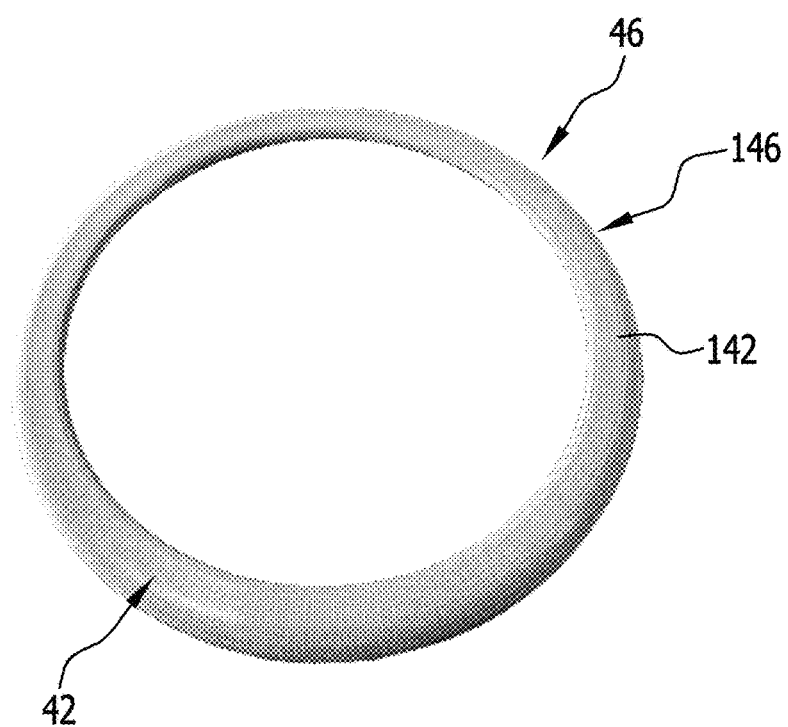
FIG. 16 shows a photograph of a process chamber component in the form of a ring.

FIG. 16 shows an image of a ring-shaped process chamber component 46 as diagrammatically shown in FIG. 15. The ring-shaped process chamber component 46 forms a shield element 146 of a shield arrangement 148 surrounding the substrate to be processed in the substrate processing chamber 138.

Figure 17:
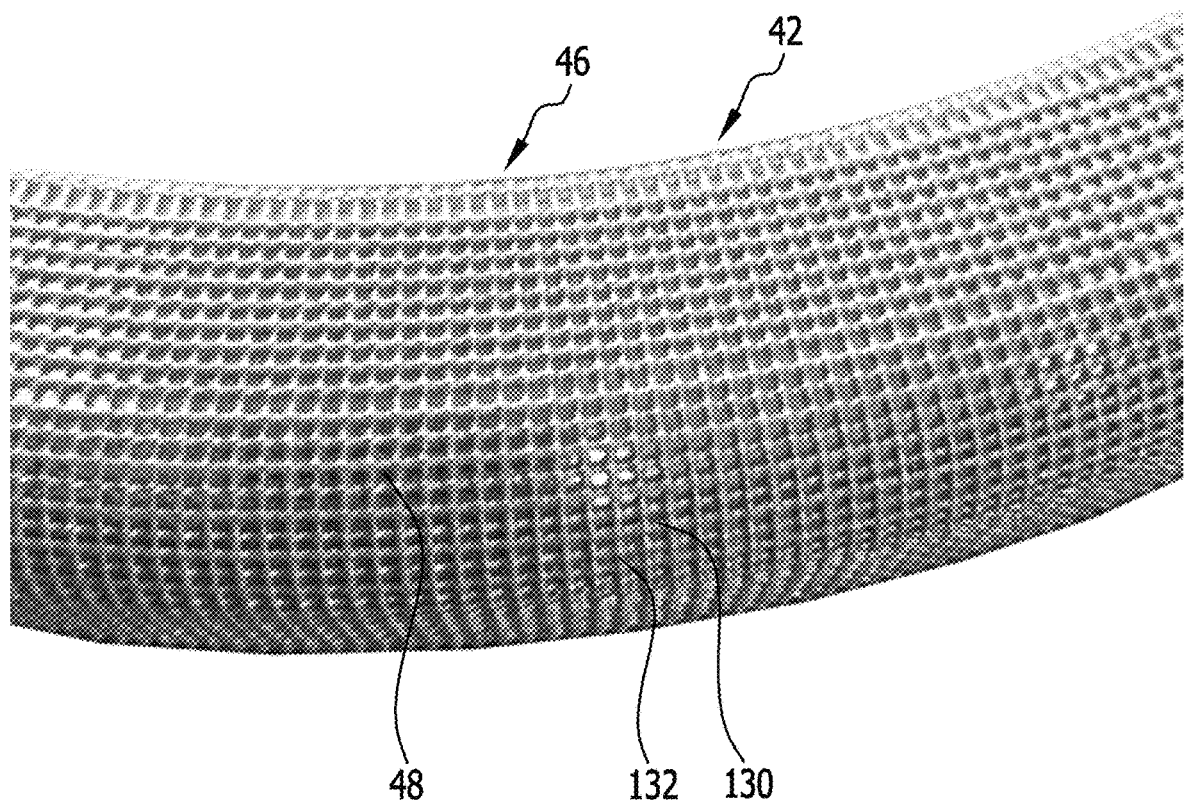
FIG. 17 shows an enlarged view of a detail of the process chamber component shown in FIG. 16.
Figure 18:
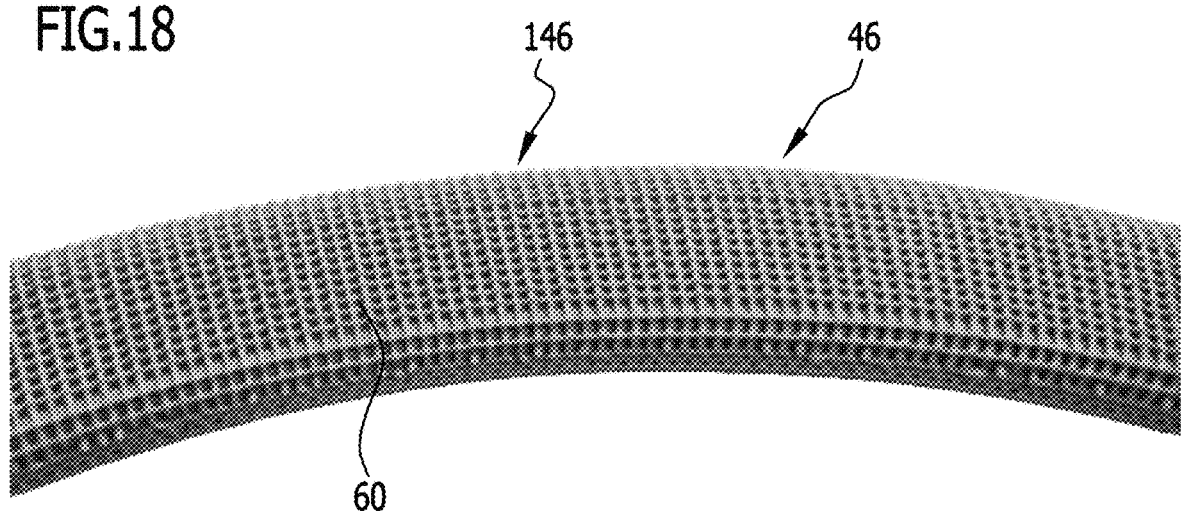
FIG. 18 shows an enlarged view of a detail of the process chamber component in FIG. 16.
Figure 19:
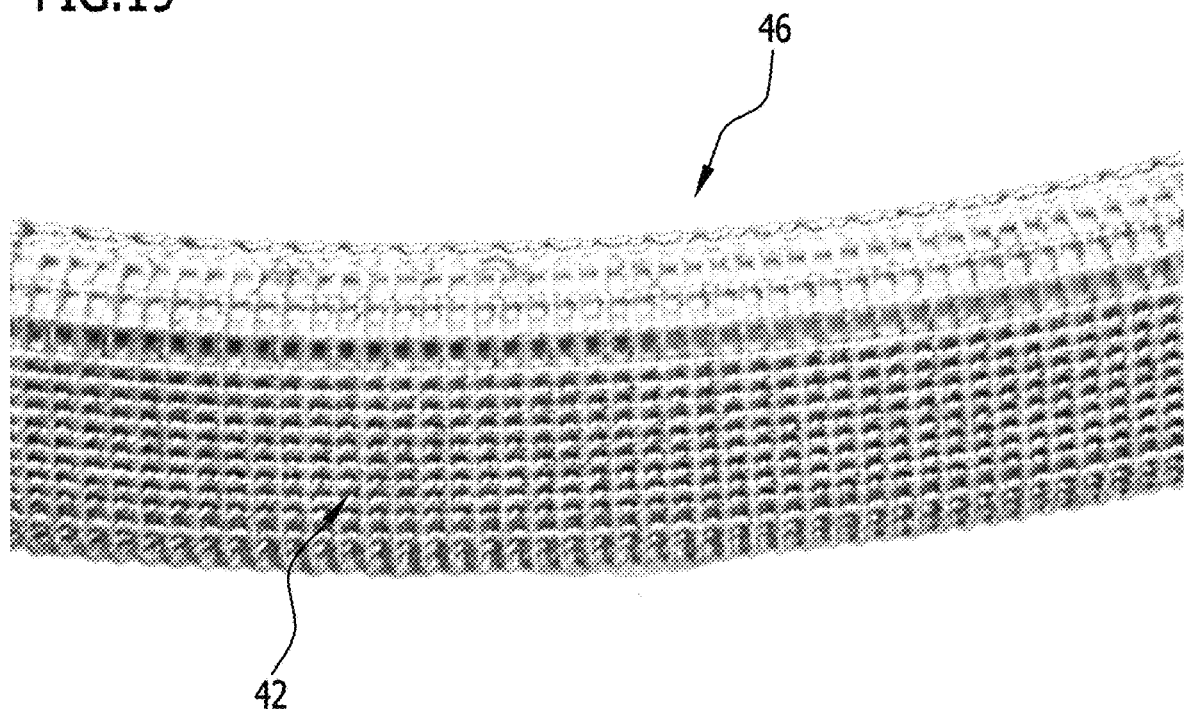
FIG. 19 shows a further enlarged view of a detail of the process chamber component shown in FIG. 16.
Figure 20:
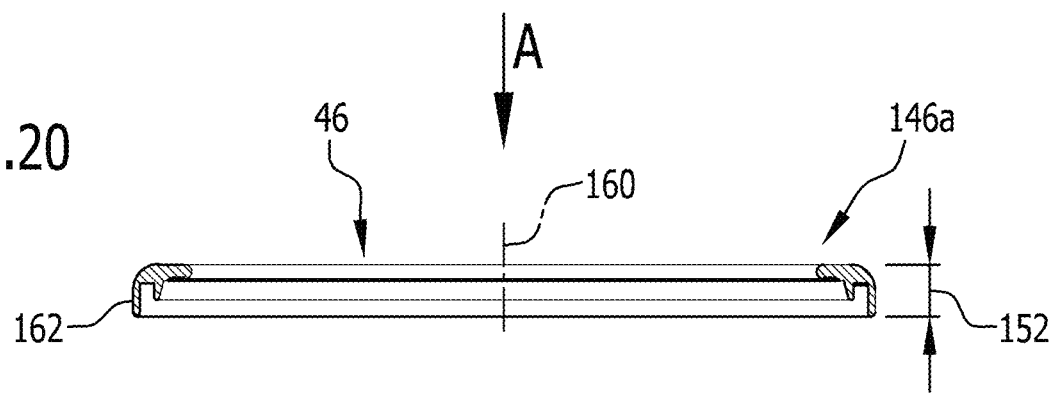
FIG. 20 shows a sectional view along line 20-20 in FIG. 21 of a further embodiment of a process chamber component.

The process chamber component 46 comprises a component surface 48 which is still visible in the enlarged images shown in FIGS. 17, 18 and 19 of the process chamber component 46 in FIG. 16. Also the strings 130 and 132 applied to the component surface 48 in an arrangement as shown in FIG. 10 are clearly visible.

Figure 21:
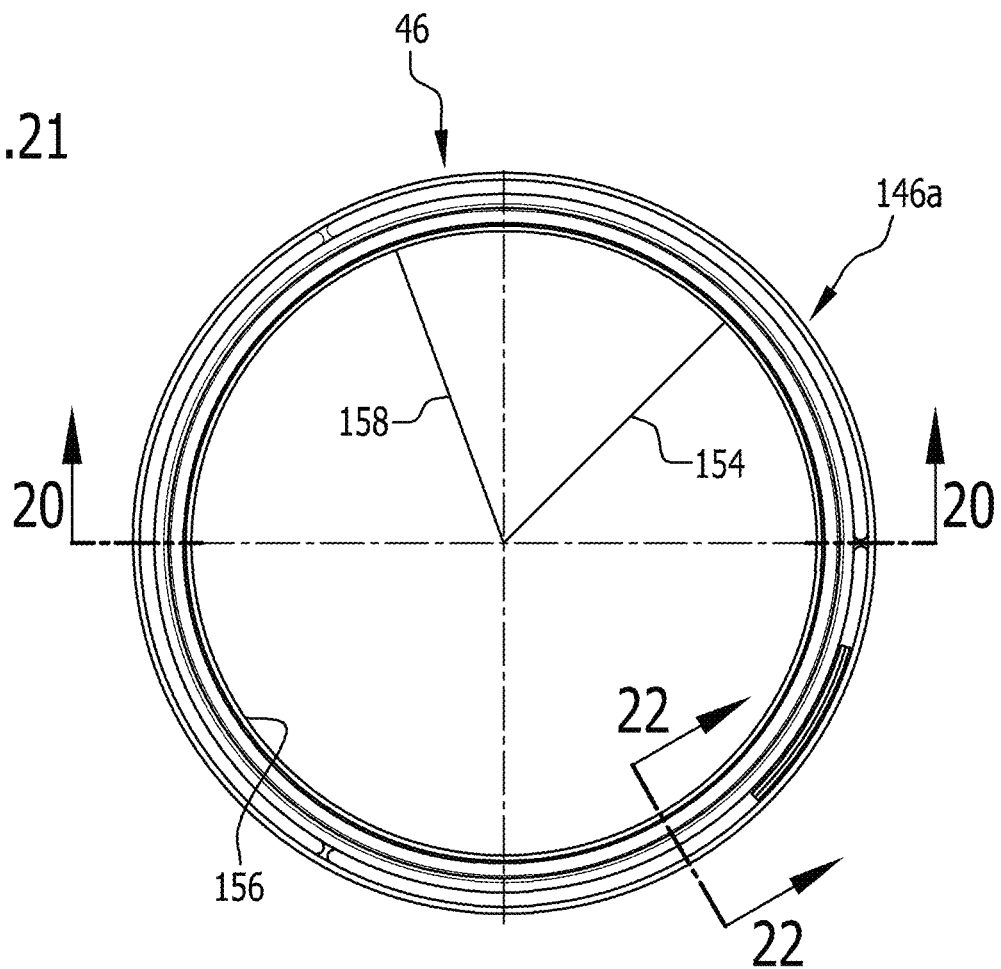
FIG. 21 shows a top plan view in the direction of arrow A of the process chamber component shown in FIG. 20.
Figure 22:
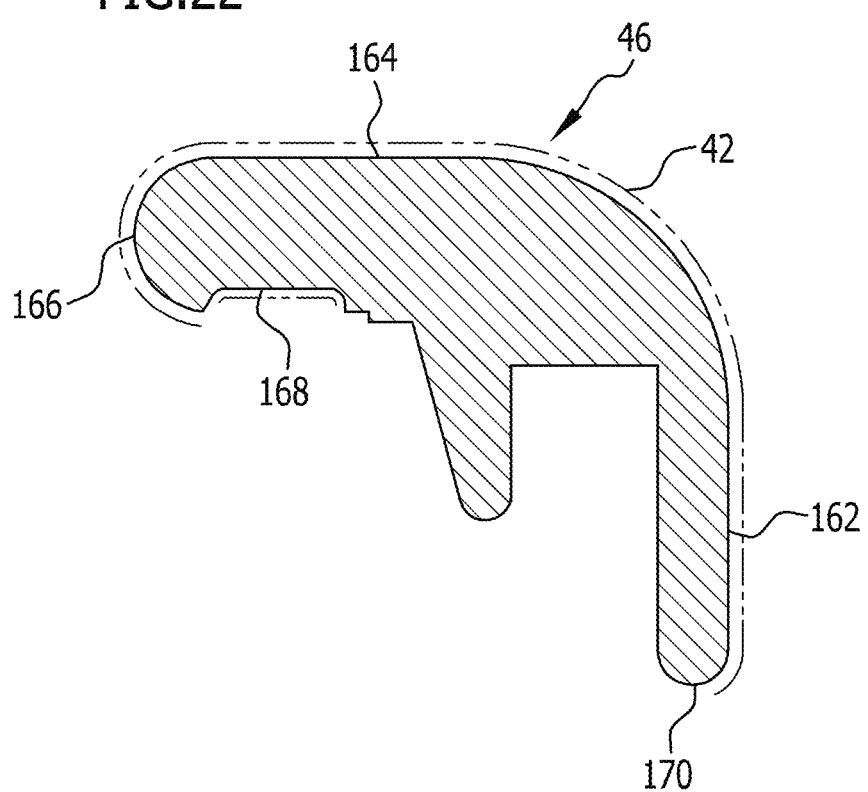
FIG. 22 shows a cross-sectional view along line 22-22 in FIG. 21.
Figure 23:
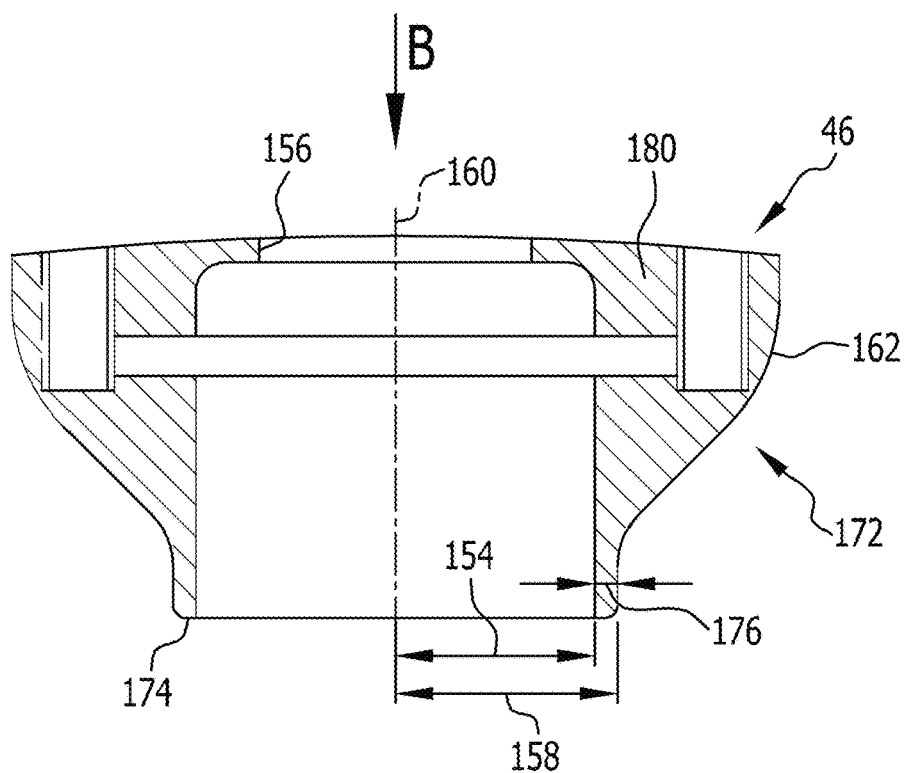
FIG. 23 shows a cross-sectional view along line 23-23 of a further embodiment of the process chamber component shown in FIG. 24.
Figure 24:
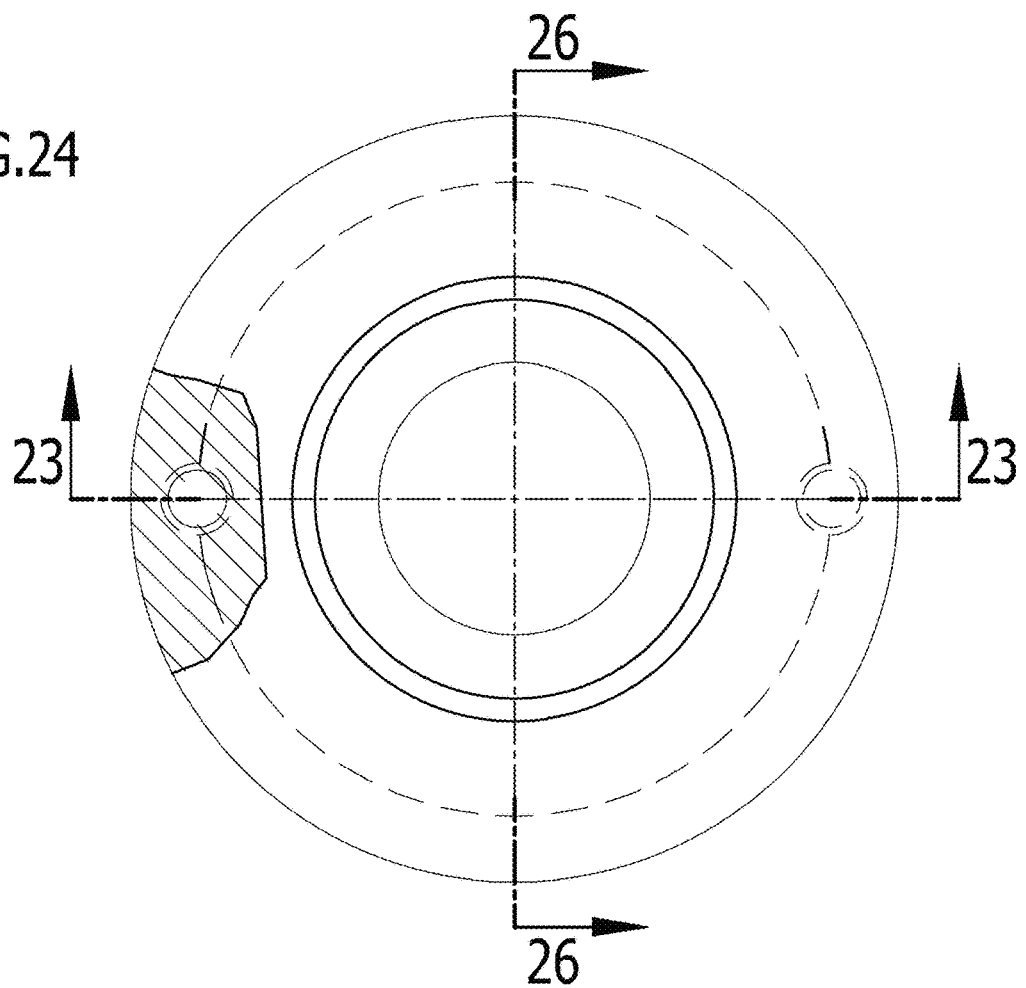
FIG. 24 shows a partially broken top plan view of the process chamber component shown in FIG. 23 in the direction of arrow B.
Figure 25:
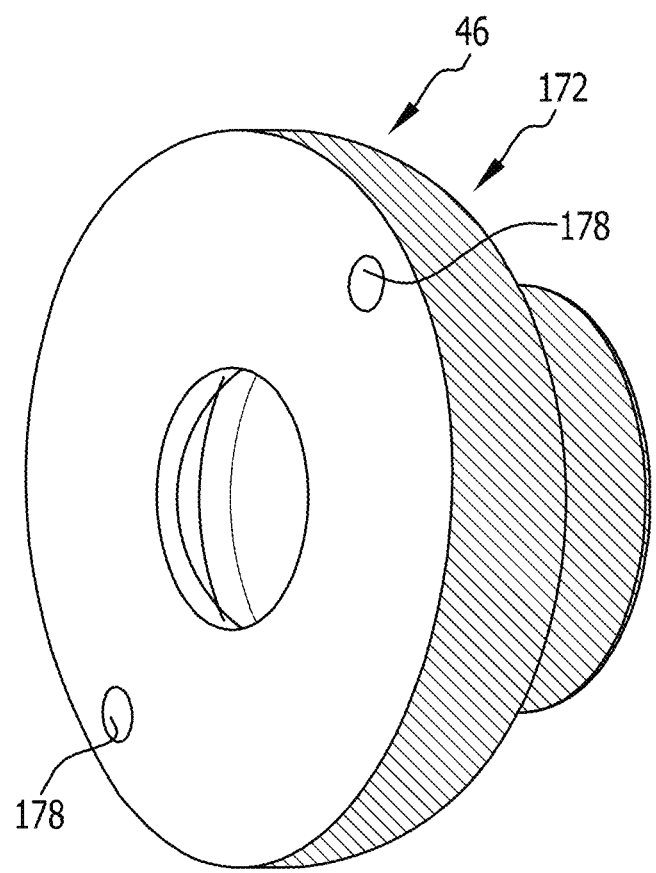
FIG. 25 shows a perspective view of the process chamber component shown in FIGS. 23 and 24.
Figure 26:
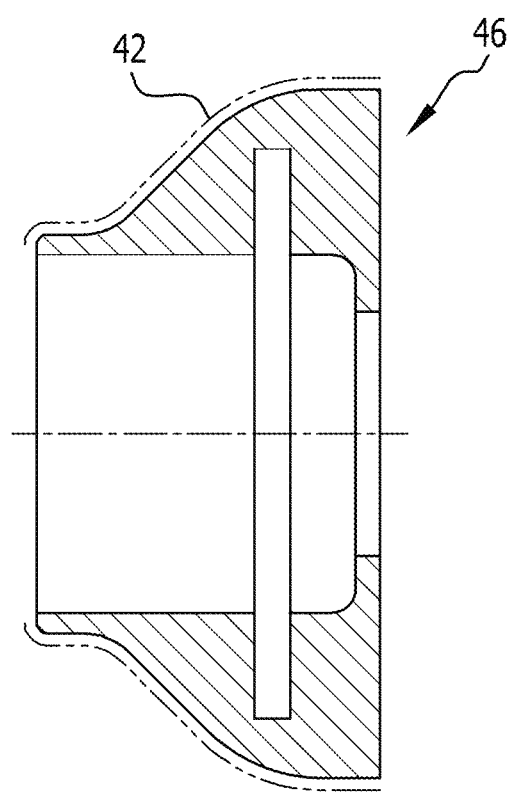
FIG. 26 shows a cross-sectional view along line 26-26 in FIG. 24.
Figure 29:
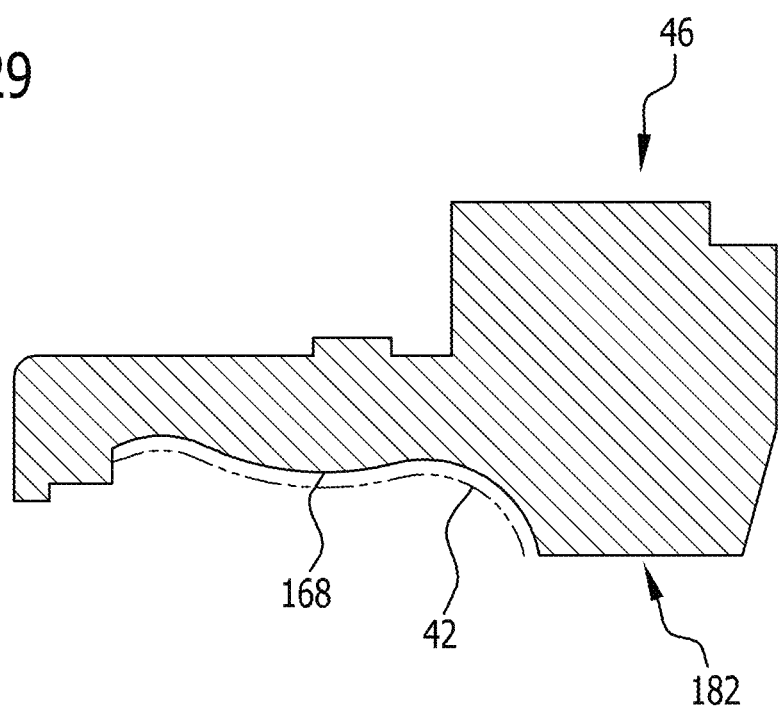
FIG. 29 shows a cross-sectional view along line 29-29 in FIG. 28.
Figure 30:
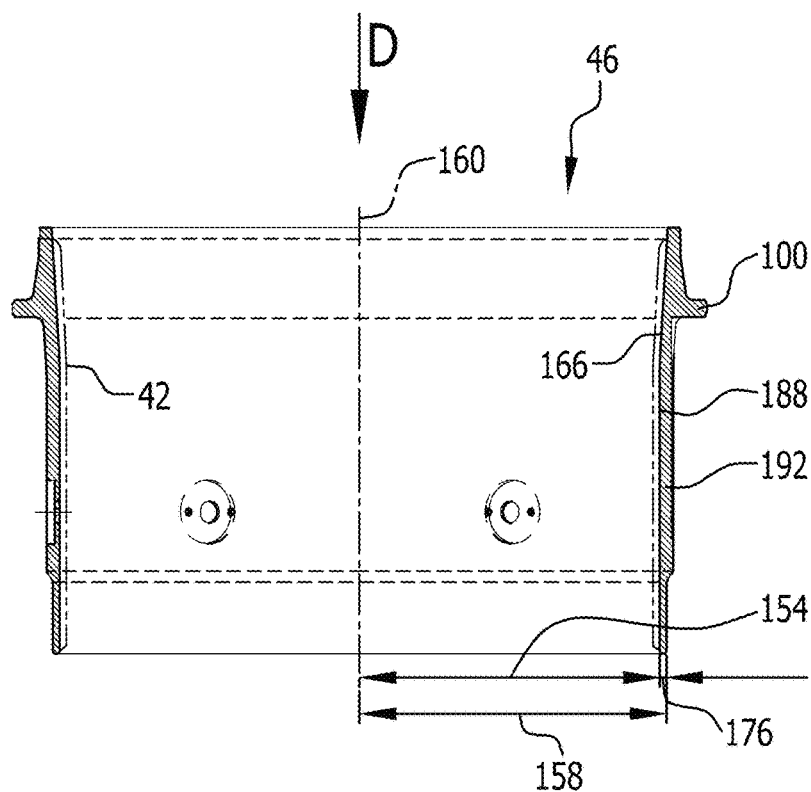
FIG. 30 shows a cross-sectional view along line 30-30 in FIG. 31 of a further embodiment of a process chamber component.
Figure 31:
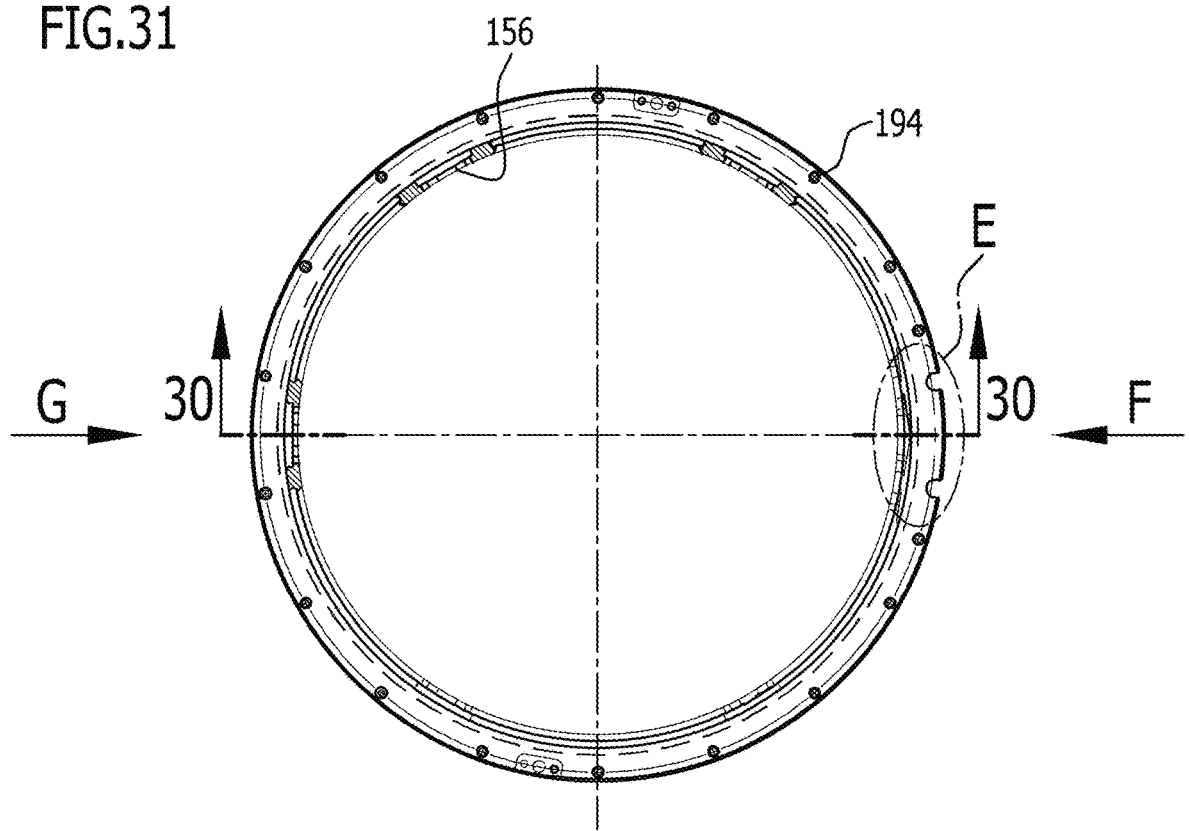
FIG. 31 shows a top plan view of the process chamber component shown in FIG. 30 in the direction of arrow D.
Figure 32:
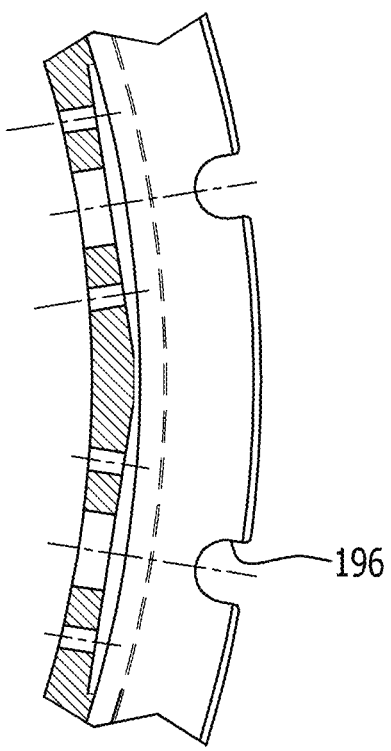
FIG. 32 shows an enlarged partial view of area E in FIG. 31.
Figure 33:
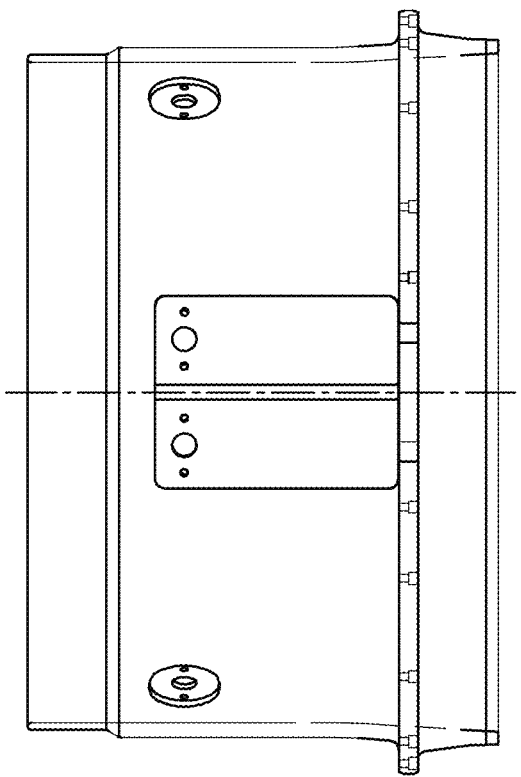
FIG. 33 shows a side view of the process chamber component shown in FIG. 31 in the direction of arrow F.
Figure 34:
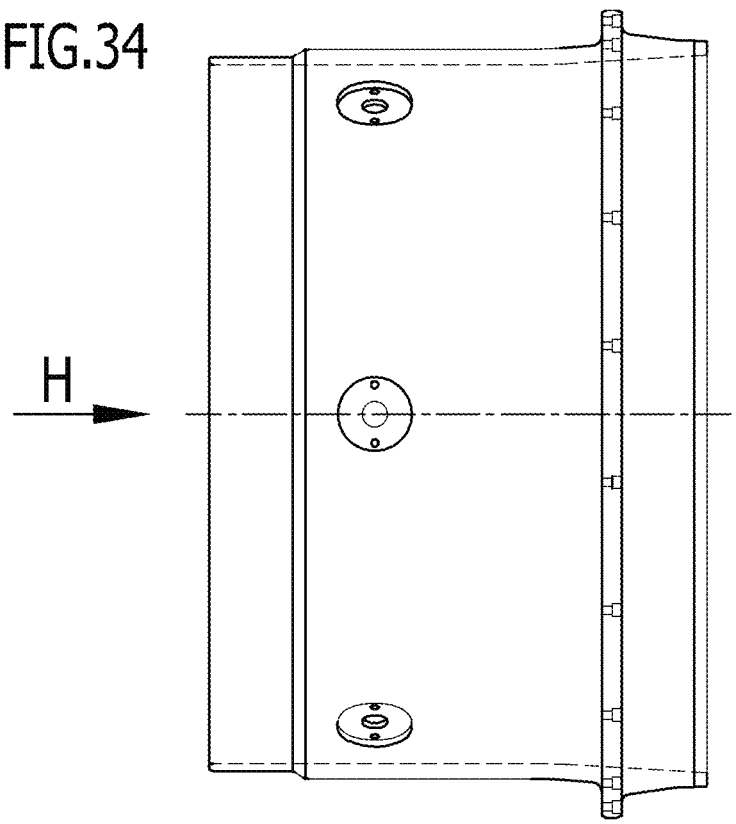
FIG. 34 shows a side view of the process chamber component shown in FIG. 31 in the direction of arrow G.
Figure 35A:
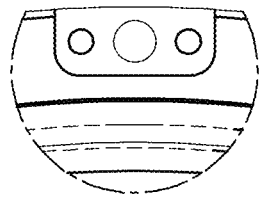
FIG. 35a shows an enlarged partial view of area I in FIG. 35.
Figure 35:
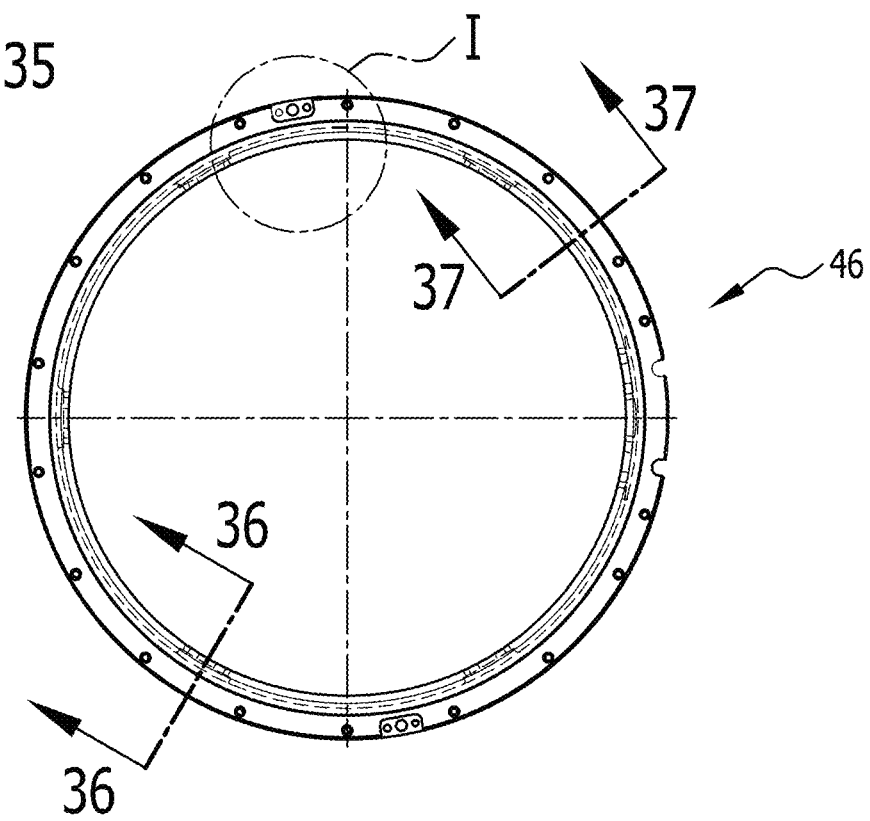
FIG. 35 shows a bottom plan view of the process chamber component shown in FIG. 34 in the direction of arrow H.
Figure 38:
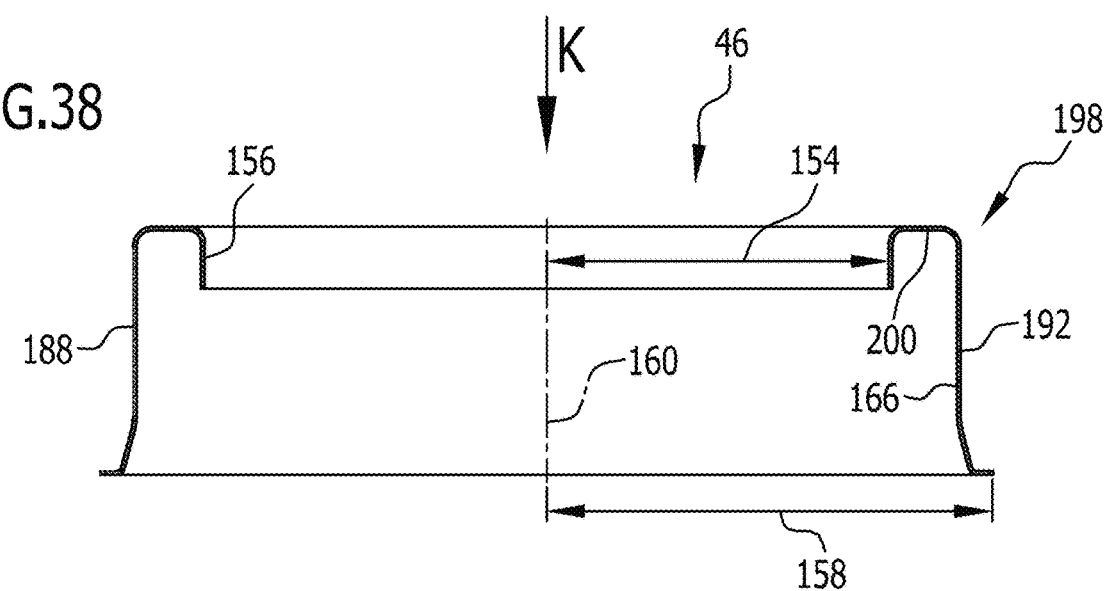
FIG. 38 shows a cross-sectional view along line 38-38 in FIG. 39 of a further embodiment of a process chamber component.
Figure 39:
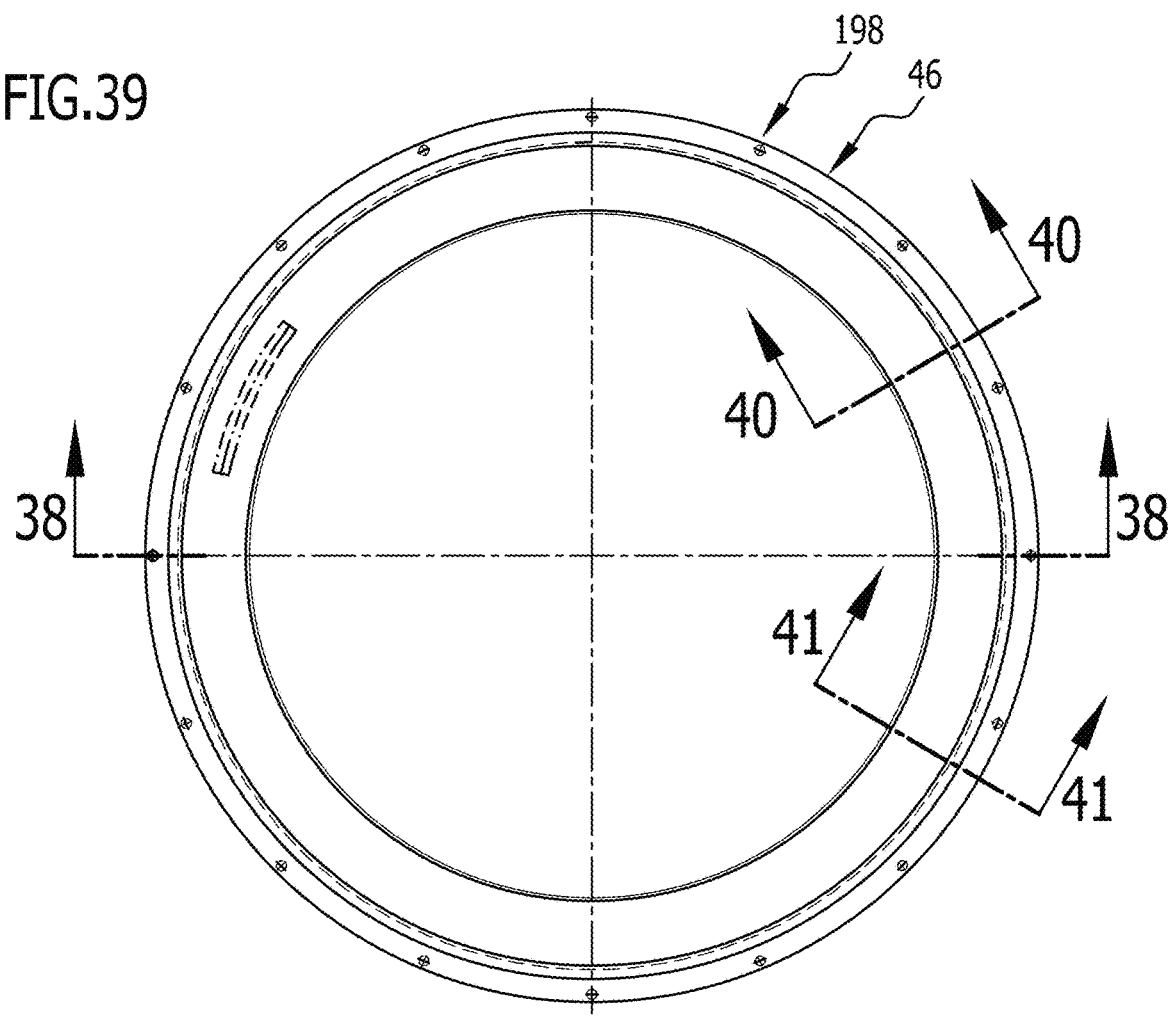
FIG. 39 shows a top plan view of the process chamber component shown in FIG. 38 in the direction of arrow K.
Figure 40:
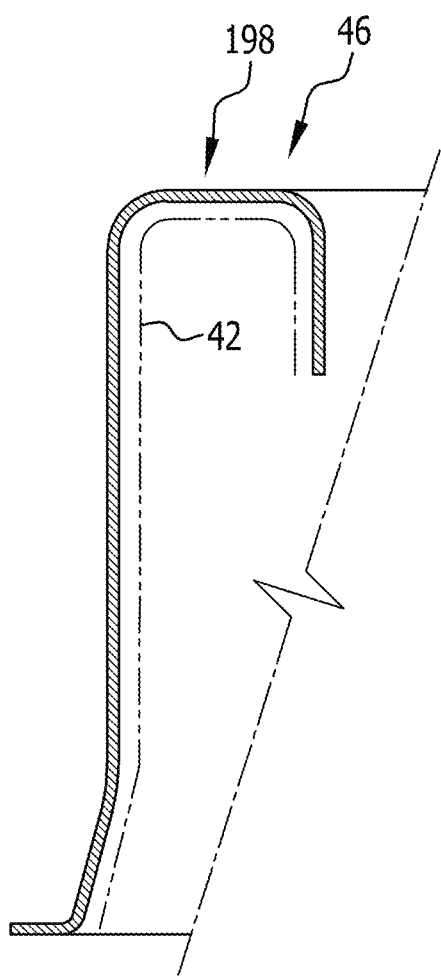
FIG. 40 shows a cross-sectional view along line 40-40 in FIG. 39.

With respect to FIGS. 21 to 22, a further embodiment of a process chamber component 46 is designed in the form of a cover ring 150. The cover ring 150 is of annular shape with a height 152 significantly less than a maximum inner radius 154 defined by a through-opening 156.

A difference between a maximum outer radius 158 with respect to a longitudinal axis 160 defined by the cover ring 150 is significantly less than 50% of the maximum inner radius 154.

The cover ring 150 has a shape which is rotationally symmetric with respect to the longitudinal axis 160.

As schematically shown in FIG. 22, a surface texture 42 is applied to part of the surface of the cover ring 150. The cover ring 150 defines an outer surface section 162 pointing away from the longitudinal axis 160. Further, the cover ring 150 has a transverse surface section 164 and an inner surface section 166. The transverse surface section 164 is planar and extends perpendicularly with respect to the longitudinal axis 160. The inner surface section 166 is convexly curved pointing towards the longitudinal axis 160.

The outer surface section 162 and the transverse surface section 164 are connected via a convexly curved connecting section pointing substantially away from the longitudinal axis 160.

A further transverse surface section 168 extends parallel to the transverse surface section 164 and is formed as the bottom of a recess on a lower wall side of the cover ring 150.

A continuous surface texture 42 is applied starting from a lower edge 170 of the cover ring 150 on the outer surface section 162 via the transverse surface section 164 to the inner surface section 166. Further, the surface texture 42 is also applied to the transverse surface section 168.

A further embodiment of a process chamber 46 is described with respect to FIGS. 23 to 26 and is formed as a cup outer feed support 172 of a shield arrangement 148. The cup outer feed support 172 is also formed rotationally symmetric with respect to a longitudinal axis 160. It comprises a through-opening 156 and has a concavo-convex outer surface section 162.

A maximum inner radius 154 of the through-opening 156 at a bottom end 174 of the cup outer feed support 172 is significantly larger than a difference between a maximum outer radius 158 at the bottom end 174 which difference defines a wall thickness 176.

Extending from a top side of the cup outer feed support 172, two blind holes 178 extend parallel to the longitudinal axis 160 into a ring-shaped body 180 of the cup outer feed support 172.

For adhering excess particles 40, the complete outer surface section 162 bears a surface texture 42 as described above.

A further embodiment of a process chamber component 46 is designed in the form a deposition ring 182 which also has a through-opening 156 extending along a longitudinal axis 160 of the rotationally symmetric deposition ring 182.

A width 184 of the deposition ring 182 is defined by a difference of the maximum outer radius 158 and the maximum inner radius 154. The maximum inner radius 154 is about five times larger than the width 184.

The deposition ring 182 defines a concavo-convex transverse surface section 168 formed by a bottom of a recess on a lower side of the deposition ring 182.

For adhering excess particles 40, the described transverse surface section 168 is bearing or supporting a surface texture 42 in the form of any of the above described surface textures 42.

A further process chamber component 46 is designed in the form of an inner shield 186 of a shield arrangement 148 and is described with respect to FIGS. 30 to 37.

A main body of the inner shield 168 has a shape of a sleeve 188 with an outwardly extending flange 190 on an outer surface thereof. A through-opening 156 extends along the longitudinal axis 160 so that a wall 192 surrounds the longitudinal axis 160 substantially concentrically. A wall thickness 176 is defined by a difference between a maximum outer radius 158 of the inner shield 168 and a maximum inner radius 154 of the through-opening 156.

A plurality of fastening openings 194 and 196 in the form of through-bores extending parallel to the longitudinal axis 160 and in the form recesses which are open away from the longitudinal axis 160 are evenly distributed about the circumference of the flange 190.

The inner shield 168 has an inner surface section 166 pointing towards the longitudinal axis 160 which is covered with a surface texture 42 as described above for adhering excess particles 40.

As schematically shown in FIGS. 36 and 37, the surface texture 42 applied on the inner surface section 166 of the inner shield 186 may comprise, in particular, two layers which continue around upper and lower edges of the sleeve 188. Further, the second layer of the surface texture 42 may comprise recesses in areas in which the wall 192 of the sleeve 188 comprises through-openings and/or recesses.

A further embodiment of a process chamber component 46 is designed in the form of a lower shield 198 which is formed as a sleeve having a wall 192 concentrically surrounding a longitudinal axis 160 defined by a through-opening 156 of the lower shield 198.

An upper edge of the sleeve 188 defines a U-shaped recess 200 or annular groove comprising three side wall surface sections extending perpendicularly with respect to each other. An inner surface section 166 of the sleeve-like wall 192 extends the outer wall section of the U-shaped recess 200. Both the inner surface section 166 and the inner wall surfaces of the recess 200 are supporting or bearing at least one of the above described types of surface textures 42.

Figure 41:
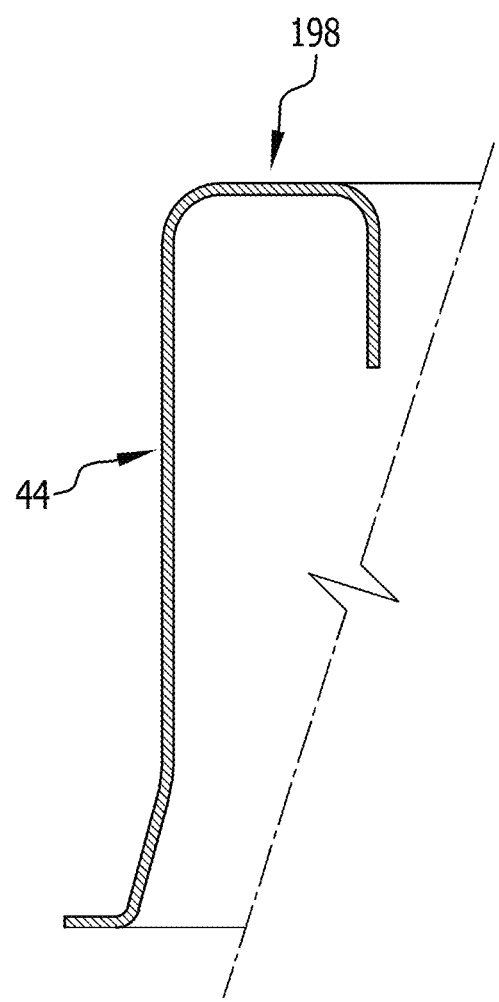
FIG. 41 shows a cross-sectional view along line 41-41 of the embodiment of a process chamber component shown in FIG. 39 without a surface texture.

For refurbishing the process chamber component 46 the surface texture 42 is removed so that an annular process chamber component structure 44 as schematically shown in FIG. 41 remains. After removing the contaminated surface texture 42 a new surface texture is applied to the lower shield 198 on the inner surface section 166 and the inner surface sections of the recess 200 as described above.

Figure 42:
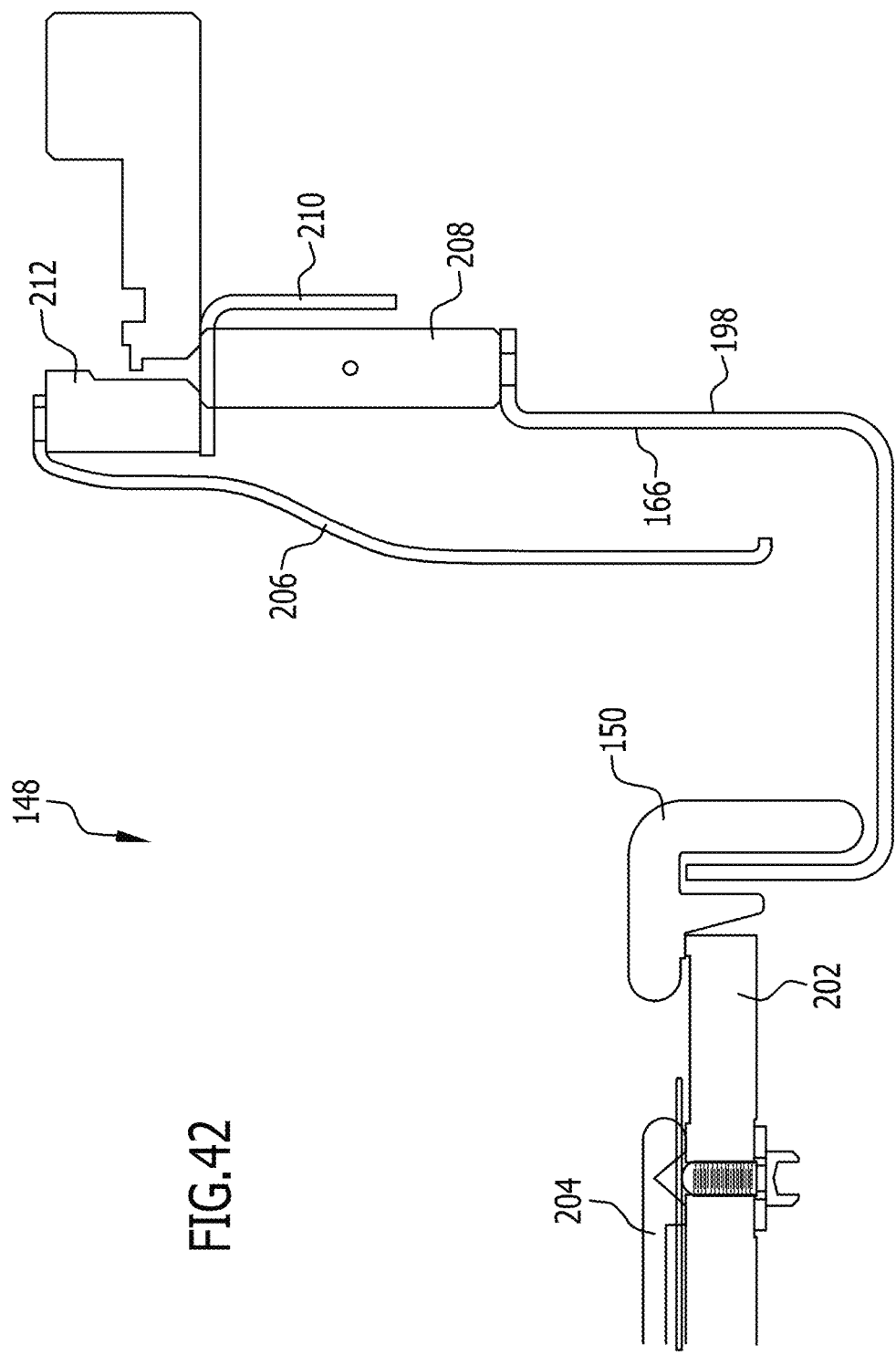
FIG. 42 shows a partial cross-section of an embodiment of a shield arrangement.
Figure 44:
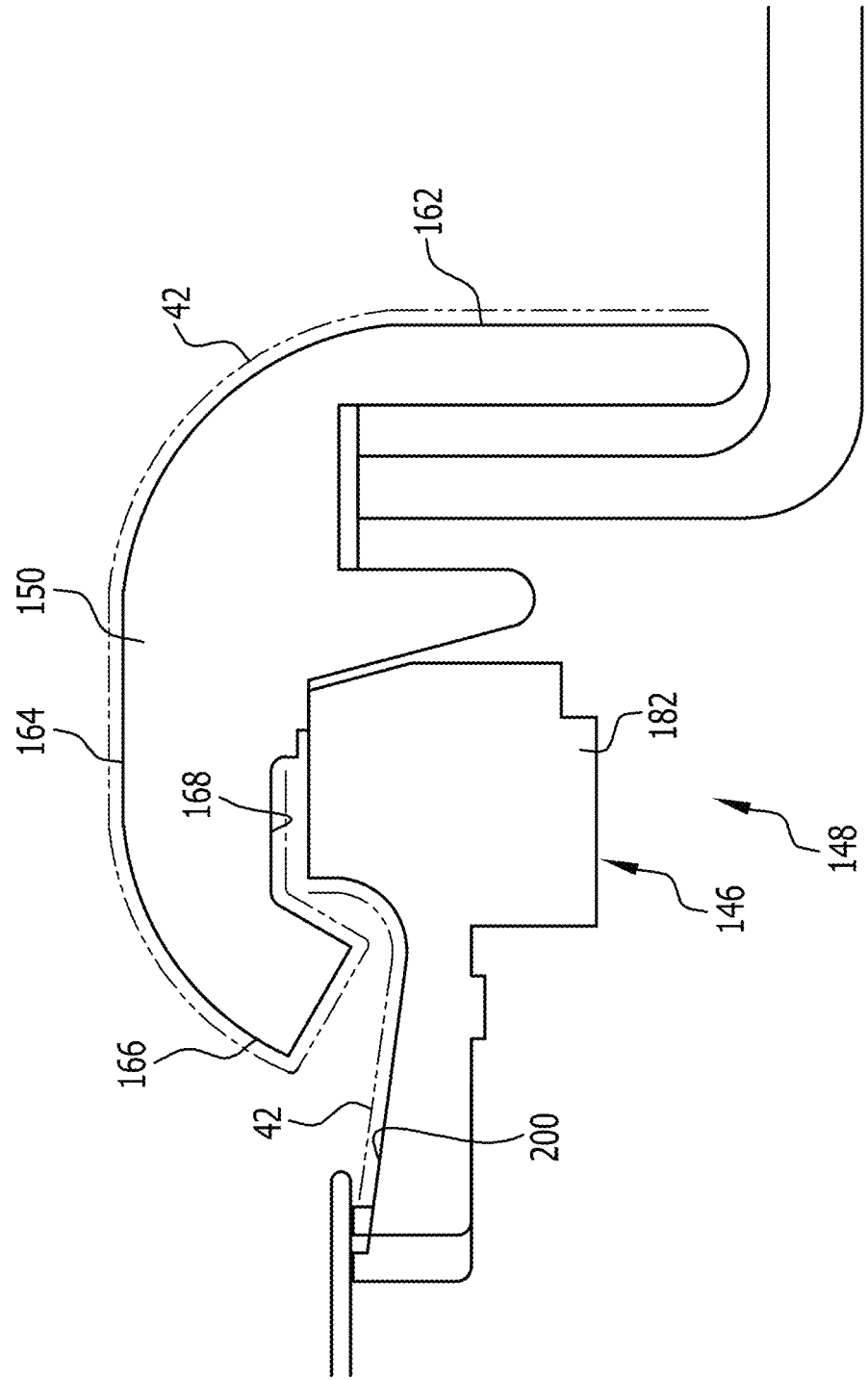
FIG. 44 shows a partial cross-sectional view of a further embodiment of a shield arrangement.

An embodiment of a shield arrangement 148 comprises, for example, as schematically shown in FIG. 42 a lower shield 198, a cover ring 150 covering a space between the lower shield 198 and a pedestal 202 which serves as a bearing element for a shutter disk 204.

An upper shield 206 partially masks a portion of an inner surface section 166 of the lower shield 198.

The upper shield 206 is mounted to the lower shield 198 by means of a shield spacer 208 which bears an adapter shield 210 on which a further spacer 212 is mounted which carries an upper edge of the upper shield 206.

With respect to FIG. 43 a further embodiment of a shield arrangement 148 comprises, in particular, an inner shield 186 which is mounted by means of a clamp shield 214 to a lower shield 198. The inner shield 186 is masking more than 50% of the lower shield 190.

A lower edge of the lower shield 198 is partially surrounded by the cover ring 150 which also partially covers the deposition ring 182.

Another embodiment of a shield arrangement 148 comprises process chamber component 46 defining a shield element in the form of a cover ring 150 partially overlapping a deposition ring 182. The deposition ring 182 has an annular groove or recess 200 defining a groove bottom which is partially planar and partially concave shaped. The groove bottom faces away from the deposition ring toward an edge of the cover ring 150 which partially overlaps the recess 200. The recess 200 supports a surface texture 42 of any of the types described above. Further, an outer side of the cover ring 150, namely the outer surface section 162, the transverse section 164, the inner surface section and the transverse section 168, are bearing a surface texture 42 of any of the types described above in order to form a capturing element for capturing excess particles in the substrate processing chamber 138.

The described embodiments of shield arrangements 148 may be used in substrate processing chambers 138 in which substrates 140 are manufactured in the form of wafers, chips or dies by means of physical vapor deposition.

As outlined above in greater detail, the process chamber component 46 can be of any form. It can be refurbished if necessary, in particular, by completely removing the surface texture 42 formed on the component surface 48 of the component structure 44 and by forming a new surface texture 42 by additive manufacturing.

REFERENCE LIST 10 process chamber component
12 component structure
14 outer surface
16 surface texture
18 recess
20 protuberances
22 electron beam
24 cavity
26 opening
28 width
30 width
32 line
34 coating
36 thickness
38 outer surface
40 particle
42 surface texture
44 component structure
46 process chamber component
48 component surface
50 texture element
52 layer
54 width
56 width
58 cavity
59 recess
60 opening
62 width
64 width
66 distance
68 apparatus
70 building chamber
72 bottom
74 platform
76 sidewall
78 powder chamber
80 bottom
82 platform
84 texture material
86 laser
88 laser radiation
90 laser beam
92 deflection device
94 object
96 roller
98 apparatus
100 nozzle
102 opening
104 laser beam
106 lens
108 nozzle opening
110 nozzle opening
112 shroud gas
114 welding zone
116 texture material
118 bead
120 cooling channel
122 surface
124 surface
126 surface
128 surface
130 string
132 string
134 recess
136 distance
138 substrate processing chamber
140 substrate
142 ring
144 process kit
146 shield element
148 shield arrangement
150 cover ring
152 height
154 radius
156 through-opening
158 radius
160 longitudinal axis
162 outer surface section
164 transverse surface section
166 inner surface section
168 transverse surface section
170 lower edge
172 cup outer feed support
174 bottom end
176 wall thickness
178 blind hole
180 body
182 deposition ring
184 width
186 inner shield
188 sleeve 190 flange
192 wall
194 fastening opening
196 fastening opening
198 lower shield
200 recess
202 pedestal
204 shutter disk
206 upper shield
208 shield spacer
210 adapter shield
212 spacer
214 clamp shield

What is claimed is:

1. A method of forming a surface texture on a process chamber component in the form of an annular shield element for use in a substrate processing chamber which is designed for manufacturing wafers, chips or dies, the process chamber component having at least one component surface, the method comprising the step of forming the surface texture on the at least one component surface so as to define at least one recess in the surface texture and so that a total surface area defined by the surface texture is greater than a total surface area defined by the at least one component surface, wherein:
the surface texture is applied to the at least one component surface by additive manufacturing;
the surface texture is applied to the at least one component surface without modifying or damaging the at least one component surface;
the surface texture is formed by applying at least one three-dimensional element to the component surface;
the at least one three-dimensional element is formed as a projection extending parallel or transversely with respect to the at least one component surface;
a plurality of layers are formed on the at least one component surface for forming a multi-layer surface texture;
the at least one three-dimensional element is formed by the plurality of layers applied on top of each other;
at least one of the projection and the plurality of layers is manufactured in the form of a first plurality of parallel wires and a second plurality of parallel wires that are arranged to cross each other substantially perpendicularly;
each of the layers applied one on top of the other for forming a three-dimensional element has a width in a direction parallel or substantially parallel to the at least one component surface,
the layers are applied with a constant or increasing width with an increasing distance of each respective layer from the component surface;
the at least one three-dimensional element is made with a cross section in the form of a mushroom.

2. The method in accordance with claim 1, wherein the surface texture is applied so as to only partially cover the at least one component surface.

3. The method in accordance with claim 1, further comprising at least one of:
a) the surface texture is applied so as to form the at least one recess in the form of an opening which allows direct access to the at least one component surface; or
(b) the additive manufacturing of the surface texture is carried out by at least one of 3D printing, selective laser sintering, direct metal deposition and laser additive manufacturing.

4. The method in accordance with claim 1, wherein a surface texture material is provided for forming the surface texture.

5. The method in accordance with claim 4, wherein the surface texture material at least one of:
a) is provided in the form of at least one metal or a metal composition, and
b) is provided in the form of a powder, and wherein the powder is applied to the at least one component surface by local heating and melting.

6. The method in accordance with claim 1, wherein a plurality of three-dimensional elements are formed on the at least one component surface.

7. The method in accordance with claim 1, wherein the first plurality of wires and the second plurality of wires are applied in at least one of zigzag, straight, circle and wavelike formations.

8. The method in accordance with claim 1, wherein the at least one recess is formed with an increasing recess cross section in a direction towards the at least one component surface so as to define a cavity with an entrance opening having a smaller width than a width of the cavity.

9. The method in accordance with claim 1, the layers are applied so as to define an oval or substantially oval cross section.

* * * * *

UNITED STATES PATENT AND TRADEMARK OFFICE
CERTIFICATE OF CORRECTION

| | | |
|---|---|---|
| PATENT NO. | : 12,269,095 B2 | Page 1 of 1 |
| APPLICATION NO. | : 16/728118 | |
| DATED | : April 8, 2025 | |
| INVENTOR(S) | : O. Marchand | |

It is certified that error appears in the above-identified patent and that said Letters Patent is hereby corrected as shown below:

On the Title Page

"(72) Inventor: Olivier Marchand, Genoble (FR)"
Should read:
-- (72) Inventor: Olivier Marchand, Grenoble (FR) --

And

"(30) Foreign Application Priority Data
Jul. 4, 2017 (WO) ............................... PCT/EP2017/066669"
Should read:
-- (30) Foreign Application Priority Data
Jul. 4, 2017 (EP) ............................... PCT/EP2017/066669 --

Signed and Sealed this
Third Day of June, 2025

Coke Morgan Stewart
*Acting Director of the United States Patent and Trademark Office*